(12) United States Patent
Smith et al.

(10) Patent No.: US 10,607,475 B1
(45) Date of Patent: Mar. 31, 2020

(54) REMOTE MONITORING SYSTEM

(71) Applicant: Underground Systems, Inc., Bethel, CT (US)

(72) Inventors: Robert F. Smith, Southbury, CT (US); Charles J. Wills, IV, Monroe, CT (US); Duncan C. Breese, New Milford, CT (US); Paul A. Alex, Fairfield, CT (US)

(73) Assignee: Underground Systems, Inc., Bethel, CT (US)

(*) Notice: Subject to any disclaimer, the term of this patent is extended or adjusted under 35 U.S.C. 154(b) by 0 days.

(21) Appl. No.: 16/360,256

(22) Filed: Mar. 21, 2019

(51) Int. Cl.
| G08B 27/00 | (2006.01) |
| G01R 31/08 | (2020.01) |
| H04W 76/19 | (2018.01) |
| G06F 9/4401 | (2018.01) |
| G08B 26/00 | (2006.01) |
| G06F 17/18 | (2006.01) |

(52) U.S. Cl.
CPC ......... G08B 27/005 (2013.01); G01R 31/083 (2013.01); G06F 9/4401 (2013.01); G06F 17/18 (2013.01); G08B 26/007 (2013.01); H04W 76/19 (2018.02)

(58) Field of Classification Search
CPC .................................................. G08B 27/005
See application file for complete search history.

(56) References Cited

U.S. PATENT DOCUMENTS

| 4,452,087 | A |   | 6/1984  | D'Antonio |
| 4,968,978 | A |   | 11/1990 | Stolarczyk |
| 5,181,026 | A |   | 1/1993  | Granville |
| 5,323,289 | A |   | 6/1994  | Longsdorf et al. |
| 5,550,476 | A | * | 8/1996  | Lau ................. G01R 15/142 324/509 |
| 5,570,263 | A |   | 10/1996 | Dion et al. |
| 5,689,180 | A |   | 11/1997 | Carlson |
| 6,774,814 | B2 |  | 8/2004  | Hilleary |
| 6,888,709 | B2 |  | 5/2005  | Princinsky et al. |

(Continued)

FOREIGN PATENT DOCUMENTS

| CN | 203202640 U | 9/2013 |
| CN | 104697587 B | 3/2014 |

(Continued)

*Primary Examiner* — Raymond L Nimox
(74) *Attorney, Agent, or Firm* — Haug Partners LLP; William S. Frommer

(57) ABSTRACT

A remote monitoring system for monitoring parameters of an underground asset, such as an electric cable system, a pipeline serving as a conduit for water, gas, oil, sewage, or the like. Parameter detectors, such as sensors that measure temperature, voltage, current, moisture, etc., are distributed along the asset to provide electrical signals that represent respective monitored parameters of the asset. An underground hub disposed in an underground vault, or manhole, through which the asset passes is coupled to the parameter detectors to acquire the signals provided by the parameter detectors. The hub includes a controller to provide data derived from the acquired signals, the data being transmitted to a remote central location by a transceiver, or modem, via LP-WAN communication. Signals from the transceiver are transmitted directly from underground.

29 Claims, 11 Drawing Sheets

(56) References Cited

U.S. PATENT DOCUMENTS

| | | |
|---|---|---|
| 6,965,320 B1 | 11/2005 | Casey et al. |
| 7,002,481 B1 | 2/2006 | Crane et al. |
| 7,061,370 B2 | 6/2006 | Cern |
| 7,292,143 B2 | 11/2007 | Drake et al. |
| 7,317,321 B2 | 1/2008 | Hilleary |
| 7,626,508 B2 | 12/2009 | Kosuge et al. |
| 7,653,394 B2 | 1/2010 | McMillin |
| 7,969,159 B2 | 6/2011 | Curt et al. |
| 8,059,006 B2 | 11/2011 | Schweitzer, III et al. |
| 8,248,252 B2 | 8/2012 | Schechter et al. |
| 8,374,228 B2 * | 2/2013 | Sanderford, Jr. ......... H04L 5/06 375/224 |
| 8,457,798 B2 * | 6/2013 | Hackett .............. G05B 19/4185 700/284 |
| 8,701,469 B2 | 4/2014 | Ober et al. |
| 8,868,359 B2 | 10/2014 | Ganesh et al. |
| 8,970,394 B2 | 3/2015 | Veillette |
| 9,546,466 B2 | 1/2017 | Wander |
| 9,961,418 B2 | 5/2018 | Rodriguez, Jr. et al. |
| 10,178,449 B1 * | 1/2019 | Struhsaker ............. H04W 4/70 |
| 10,306,442 B1 * | 5/2019 | Nuttall ................. H04W 40/02 |
| 2004/0131125 A1 * | 7/2004 | Sanderford, Jr. ......... H04L 5/06 375/261 |
| 2005/0255828 A1 | 11/2005 | Fisher et al. |
| 2006/0161403 A1 * | 7/2006 | Jiang ....................... G06N 20/00 703/2 |
| 2007/0229295 A1 * | 10/2007 | Curt ................... G01R 31/2829 340/653 |
| 2009/0167308 A1 * | 7/2009 | Lomes ................... G01V 3/081 324/326 |
| 2010/0188245 A1 * | 7/2010 | Nielsen ..................... G01V 3/08 340/686.1 |
| 2011/0111700 A1 * | 5/2011 | Hackett .................. A01G 25/16 455/41.2 |
| 2013/0064178 A1 | 3/2013 | Cs et al. |
| 2013/0234860 A1 | 9/2013 | Sollacher et al. |
| 2015/0181315 A1 | 6/2015 | Vuran et al. |
| 2016/0356665 A1 | 12/2016 | Felemban et al. |
| 2017/0197583 A1 * | 7/2017 | Izraeli ................... B60R 25/102 |

FOREIGN PATENT DOCUMENTS

| | | |
|---|---|---|
| CN | 104254079 A | 12/2014 |
| CN | 104298156 A | 1/2015 |
| EP | 2619931 B1 | 7/2013 |

* cited by examiner

| SAMPLES | | | ARRANGE FROM LOW TO HIGH | | | SAMPLE VALUE |
|---|---|---|---|---|---|---|
| A | B | C | A | B | C | |
| 45 | 45 | 35 | 35 | 22 | 22 | min. |
| 47 | 47 | 36 | 35 | 29 | 27 | |
| 37 | 22 | 37 | 37 | 30 | 28 | |
| 35 | 35 | 32 | 37 | 35 | 29 | |
| 48 | 51 | 39 | 38 | 35 | 30 | |
| 47 | 60 | 54 | 39 | 37 | 31 | 25% |
| ... | ... | ... | ... | ... | ... | |
| ... | ... | ... | ... | ... | ... | |
| 35 | 35 | 27 | 40 | 38 | 32 | |
| 47 | 51 | 39 | 40 | 39 | 32 | |
| 37 | 37 | 28 | 41 | 40 | 34 | |
| 38 | 38 | 29 | 44 | 44 | 32 | med. |
| 40 | 40 | 31 | 45 | 45 | 32 | |
| 41 | 29 | 22 | 46 | 46 | 36 | |
| 48 | 51 | 39 | 47 | 47 | 36 | |
| ... | ... | ... | ... | ... | ... | |
| ... | ... | ... | ... | ... | ... | |
| 60 | 60 | 46 | 47 | 47 | 36 | |
| 40 | 30 | 32 | 47 | 47 | 37 | |
| 47 | 47 | 36 | 47 | 51 | 39 | |
| 46 | 46 | 35 | 47 | 51 | 39 | 75% |
| 47 | 47 | 36 | 48 | 51 | 39 | |
| 39 | 39 | 30 | 48 | 60 | 46 | |
| 44 | 44 | 34 | 60 | 60 | 54 | max. |

FIG. 4A  FIG. 4B  FIG. 4C

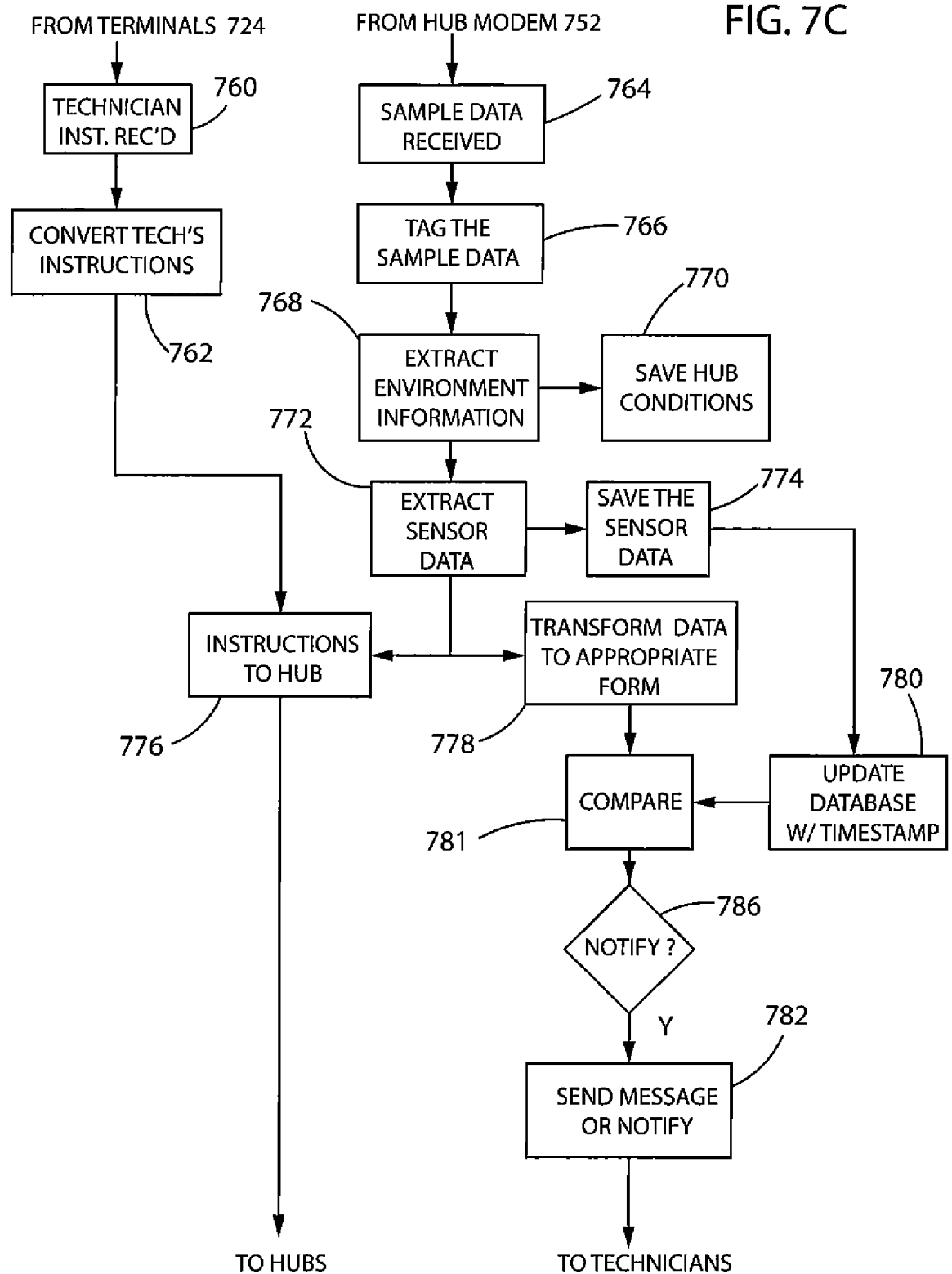

REMOTE MONITORING SYSTEM

This invention was made with Government support under Grant DE-SC0004280 from the United States Department of Energy. The Government has certain rights in the invention.

BACKGROUND OF THE INVENTION

(1) Field of the Invention

This invention relates generally to a monitoring system for monitoring parameters of an underground asset, such as an underground cable system, pipeline, water line, sewer line, and the like.

(2) Background

In the field of underground electric power cables, water pipelines, oil and gas pipelines, sewage lines and the like, referred to generally as underground assets, it is important to monitor the operating and/or environmental conditions of those assets. Unexpected or unusual behavior may be indicative of future dangerous or fault conditions. Notice of such behavior in the underground asset may permit accelerated maintenance or remedial action which, in turn, might prevent the asset from becoming inoperative or going off-line for prolonged periods of time.

Monitoring the behavior of such underground assets may foretell problem situations that can be remedied before they become difficult and time consuming to repair. However, such underground assets, such as electric power cables, may not be readily accessible, making it difficult to monitor their operating characteristics. Furthermore, periodic examinations by skilled technicians over the route travelled by the asset, as well as over the life of the asset, are labor intensive and may require service outages for equipment inspections. Such examinations generally are limited to vaults, manholes and smaller below grade enclosures, known as handholes, and curb boxes that are spaced along the route the asset follows, Access to the asset in large enclosures, e.g. manholes, requires safety equipment and procedures and, more often than not, "pump down" of residual standing water that has entered through the manhole covers or through the pipe or conduit penetration seals. It has been found, the time required to carry out actual inspection of the asset is significantly less than the time required to prepare for safe entry into the confined space. Consequently, inspections are performed infrequently; and often performed after an operating failure to investigate the cause and ascertain similar exposure scenarios system wide.

There is a need for a system that can monitor the operating characteristics of the underground asset, and without human intervention, send indications of the condition of the asset to a monitoring center, often miles away, for analysis. It is advantageous that such indications extend beyond simple alarms based on equipment having reached or exceeded preestablished operating limits. It is beneficial if such indications include deviations from expected behavior based on historical factors. Sensors for producing electrical signals representing operating and/or environmental parameters of the underground asset are known. However, such sensors must be disposed underground; and it is difficult to transmit the signals, or to transmit data representing the parameters measured by the sensors, directly from underground locations to the monitoring center. The installation of physical conduits, such as fiber optic cables, to provide communication links from such sensors to the monitoring center are prohibitively expensive, especially for retro-fitting an existing system, and often need additional power supplies for such communication links.

Additionally, monitoring devices disposed along the asset, and particularly in the underground vaults through which the asset passes, should be self-contained. Accordingly, the monitoring devices should be provided with power supplies that exhibit a relatively long life. Although electric power for the monitoring device can be harvested from the electric power cable in the vault, such power is not available for extended periods of time when the asset is lightly loaded or de-energized, as would be needed for inspection and/or maintenance. Moreover, while it is possible to harvest electric power from an electric power cable, acquiring electric power from other underground assets (e.g. water line, gas pipeline and the like) may not be available. Power from nearby utility sources may require civil excavation and street restoration, which are not preferable and should be avoided whenever possible. Hence, battery power for the monitoring device is preferable. But, conservation of such battery power is desirable, particularly for an underground monitoring device installed in remote locations. Consequently, it is advantageous to provide prudent operation of the monitoring device and of the overall monitoring system to extend battery life, if possible, such as by operating the monitoring device in a "watchdog" mode where frequent data transmissions are not needed.

In addition, it would not be unusual for remotely located underground monitoring devices to experience interruptions in power supplied to the devices or more likely, occasional interruptions in communication between the devices and the monitoring center. When such interruptions occur the operating status of the monitoring devices might not be accurately known until power or communication is restored. It is therefore advantageous for the remote monitoring device to automatically and independently restore its operation and for the system to recover all available data since the last successful transmission.

SUMMARY OF THE INVENTION

Therefore, the present invention is directed to a remote monitoring system for monitoring parameters of an underground asset, such as an electric cable system, a pipeline serving as a conduit for water, gas, oil, sewage, or the like. Parameter detectors, such as sensors, are installed at discrete location that are distributed along the asset to provide electrical signals that represent respective monitored parameters of the asset including those parameters that provide a condition assessment of the vault or manhole containing the pipe or conduit system. Examples of sensors include sensors that measure temperature, voltage, current, moisture, gas content, oil and water contamination, etc. In one embodiment, an underground hub is coupled to the parameter detectors to acquire the signals provided by the parameter detectors. Preferably, the hub is disposed in an underground vault, or manhole through which the asset passes, or a below grade curb box, or hand-hole with access leads to the asset along the asset's route. The hub includes a controller to provide data derived from the acquired signals, the data being transmitted to a remote central location by a transceiver, or modem.

In one embodiment, the transceiver is located below grade in the hub or in the vault; and transmits the data wirelessly from the vault via low-power wide-area (LP-WAN) network communication to the central location whereat the transmitted data is analyzed to characterize the asset. The central location determines, from the data transmitted by the hub, and preferably, from data transmitted by a number of hubs, the behavior and condition of the asset.

The transceiver also is operable to receive communications from the central location, and via low-power wide-area network communication, for controlling the controller. In one embodiment, the communications are instructions to control the number of signals to be acquired from the parameter detectors, the frequency or how often the signals are acquired from the parameter detectors, and the rate at which sensor data is transmitted from the hub to the central location. Other instructions pertaining to hub operation may at times and on occasion be issued to the controller In accordance with an embodiment, the hub processes and transmits a reduced amount of data, derived from the signals acquired from the parameter detectors. Preferably, the signals from the parameter detectors are sampled, advantageously at a rate that is relatively low when no unusual behavior of the asset is determined and increased when more data is needed to properly determining the behavior of the asset. The data that is transmitted is a derived set of values representative of the sample values. As a result, battery power is conserved while, at the same time, sufficient information is sent to the central location to satisfactorily determine the behavior of the asset.

BRIEF DESCRIPTION OF THE DRAWINGS

The following detailed description, given by way of example, will best be understood when read in conjunction with the accompanying drawings in which:

FIG. 3A is a timing diagram useful to explain on operating mode of the hub illustrated in

FIG. 1;

FIGS. 4A-4C are useful to explain one technique for reducing the amount of data transmitted from the hub to the central location;

FIG. 7C is a flow chart illustrating functions performed by the central server.

DETAILED DESCRIPTION

Figure 1:
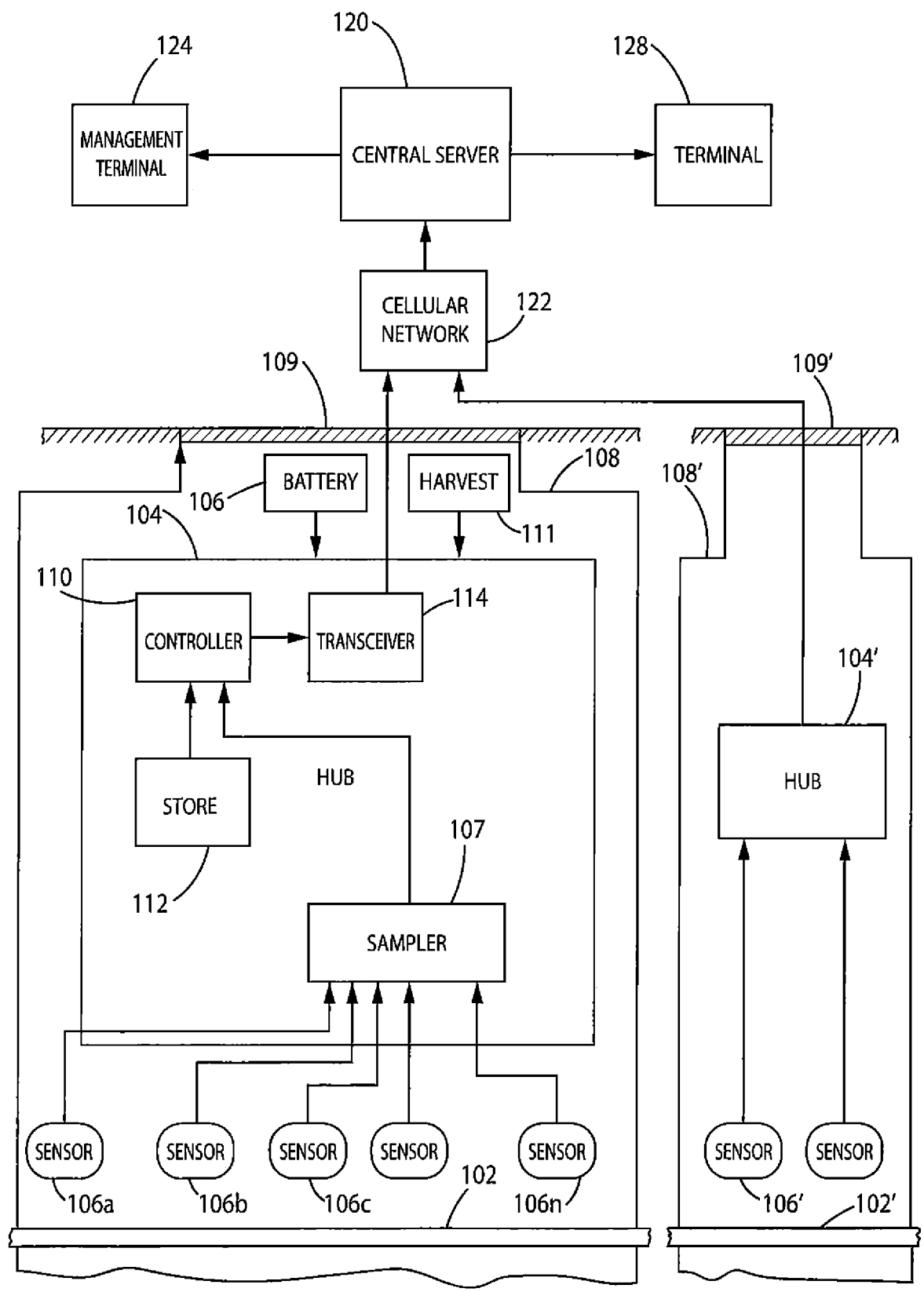
FIG. 1 is a block diagram of one embodiment of the remote monitoring system of the present invention.

Referring now to the drawings, FIG. 1 is a block diagram of one embodiment of the remote monitoring system in accordance with the present invention, wherein a hub 104 disposed in an underground vault 108 monitors parameters of underground asset 102; processes and sends data derived from the monitored parameters to a central location 120, for example, a central server. Alternatively, the hub may be installed in a below grade curb box or handhole. In this embodiment, hub 104 includes sampler 107 coupled to sensors 106a, 106b, . . . 106n to sample the signals produced by the sensors. The sensors are distributed externally of the hub and are adapted to produce signals representing the detected or sensed parameters of the underground asset, such as temperature, pressure, voltage, current and the like. The sensors may be simple lead wire taps or more sophisticated or complex transducers. The asset may be an electric power cable, an oil, gas, water pipeline, or other conduits, accessories or ancillary equipment associated with the asset. For convenience, the asset 102 is described herein as an electric power cable, sometimes referred to as an underground cable system or simply as a cable. However, reference to a cable system, as used herein, is intended to include the assets mentioned above, such as, but not limited to, water pipelines, oil and gas pipelines and sewage lines, as well as equipment included in manholes, link boxes, and the like.

Vault 108 is accessible through a cover 109; and may be a typical manhole known to those of ordinary skill in the electric utility art. The electric cable can be a power cable adapted for high voltage or medium voltage transmission, or a low voltage secondary circuit. The hub 104 typically is installed in a manhole through which the cable 102 passes. However, the hub may also be installed in a below grade curb box or hand-hole containing lead wires attached to the below grade asset. The asset may be the manhole itself or other equipment within the manhole. Those of ordinary skill in the art recognize that a vault is a larger structure than a manhole and may contain multiple assets including transformers, switches and the like; whereas a manhole, as well as a hand-hole, is smaller and simpler than a vault. Hub 104 serves to acquire representations of the operating parameters of the asset. The hub preferably is disposed in the vault or manhole, but may be buried directly below the surface of the earth.

The sampler 107 may be a conventional A/D converter and sampler to produce digitized sampled values of the signals supplied thereto from the sensors 106a, . . . 106n. A controller 110 located in the hub 104 is adapted to receive the sensor samples from sampler 107. Preferably, the sampler is disposed within hub 104, but optionally, the sampler may be externally of the hub.

The hub also includes a wireless transceiver 114, or modem, for communicating with the central server 120. The central server is remote from the hub 104 and, as will be described, analyzes data transmitted from the hub and preferably, from a plurality of hubs. This data is derived from the sampler, as discussed below, and represents the parameters monitored by the sensors. In one embodiment, the central server includes a data processor and is adapted to provide indications of the local operating condition of the cable 102 based on the data transmitted from the hub.

The data from hub 104 may be integrated with data received from other hubs 104' in vaults 108' installed at other locations to characterize the overall cable system and enable asset managers to identify abnormalities and schedule system maintenance as needed, rather than rely on fixed periodic audits. For example, the central server is adapted to determine whether the measured parameters, and thus the cable system are operating within normal or expected ranges. The central server also is adapted to determine if the present operating conditions of the cable are consistent with past operations based on historical values. Variations, if any, in the operating conditions of the cable system, as represented by the sensor signals from one hub compared to the sensor signals from another hub, are sensed by the central server to determine if such variations are outside the normal operating range of the cable system and, if so, an alarm may be generated.

Data representing the sampled sensor signals are transmitted as data packets via the wireless transceiver 114 to the central server. The transceiver operates in accordance with a cellular low power-wide area network (LP-WAN), such as LTE-M and NB-IoT communication technology installed and operated by cellular carriers such as AT&T, Verizon and other cellular service providers known to those of ordinary skill in the art. In one embodiment the hub transceiver can access several service providers of different networks and seamlessly select a preferred network based on signal strength and quality. Accordingly, the transceiver may transmit the data from underground directly to a cellular network 122 and then to the server, such as by Internet connection, cellular communication, or the like. In one embodiment, the hub includes the transceiver 114 and a suitably designed antenna to transmit the data via LP-WAN communication. In another embodiment, the transceiver disposed in hub 104 is connected to the antenna located within the vault but outside the hub 104. In a still further embodiment, the antenna is located below ground, but outside the vault, manhole or hand-hole, and is wire-connected to the transceiver. In a still further embodiment, the antenna and transceiver are located externally of the hub 104 but disposed below ground. It is contemplated, use of the cellular network can be omitted, and data can be transmitted directly from the hub to the central server.

Power to the hub is supplied by a suitable power supply, such as a battery 105. Alternatively, necessary power may be harvested from the power cable 102 or its associated shielding systems by harvesting apparatus 111, such as an inductance coil, a Rogowski coil or other known apparatus, or routed to the vault from a locally available utility power source. In the preferred embodiment, battery 105 exhibits relatively long life, such as on the order of two years or more; and may be prolonged by harvesting power to supplement the power needed to support the hub activities or to recharge the battery. As discussed below, battery life is enhanced, and power is conserved, by operating the sampler and the transceiver at controllable, preferably brief intervals and not continuously. Additionally, and as will be described, not all of the digitized samples are transmitted to the central server, thereby reducing the amount of data that is transmitted and, thus, reducing the power drawn from the battery.

In the embodiment shown in FIG. 1, terminals 124 and 126 communicate with the monitoring system via the central server 120. Terminal 124 functions as a management terminal and serves as a human interface to manage the remote monitoring devices and to upload hub instructions for controlling the hubs to the central server for subsequent downloading, or transmission, to the hubs. While terminal 126 also may be used for a management functionality, system management operations preferably are limited to individuals having the appropriate authority and security clearance to do so. For the purpose of this discussion, terminal 124 is assumed to be operated by, and serves as an interface with, such individuals. Communication between the terminals 124, 126 and the central server 120 may be wireless or hard wired, as in accordance with a cellular or internet network.

As described below, the central server 120 is adapted to send operating instructions to the hub 104 via the cellular network LP-WAN communication. The instructions, which may be uploaded to the central server from terminal 124 are received by the transceiver 114 to control the controller. In one embodiment, terminal 124 may be provided with computer functionality adapted to analyze the indications and data provided by central server 120 and to generate instructions to be sent to the hub; and terminal 126 may be adapted to access the indications and data from the central server but not have the ability to generate instructions. For example, and as discussed below, the instructions uploaded to the central server establish the sampling intervals for sampling the sensor signals (sample size); the sampling frequency, (how often the sensor signals are acquired); and the transmission frequency, (how often the data representing the sensor signals are transmitted to the central server). Normally, in the periodic sampling or "watchdog" mode, instructions issued by a technician at terminal 124 via the central server to the hub call for data to be sampled and transmitted less frequently to conserve battery power. However, depending upon determinations made by the central server, based upon the parameters sensed by different hubs in the cable system, the central server may transmit instructions either to increase or decrease the sampling interval, the sampling frequency, and the transmission frequency so as to adjust monitoring parameters to acquire additional data at the expense of battery life. In one embodiment, the controller 110 may also operate autonomously to change the sampling interval, sampling frequency, transmission interval and/or transmission frequency based on locally sensed conditions derived from the sensors as will be described herein.

Hub 104 includes a storage device, such as a memory, referred to as a store 112. The store is adapted to store data representing the sampled sensor signals. Advantageously, in the event of interruption of power to the hub, or loss of communication between the hub and the central server, the data stored in store 112 may be transmitted to the central server 120 when power or communication is restored. Accordingly, data that had been acquired but not sent at the time of power or communication interruption, and that might be needed to determine the operating condition of the cable system, is transmitted upon restoration.

Store 112, or preferably another memory (not shown), is adapted to store instructions for initializing controller 110, such as when hub 104 is placed in service. This memory also may store instructions to operate the controller in a recovery mode upon restoration of power or communication. The functions performed by these instructions are described below. This memory, or yet another memory, is adapted to store instructions received from the central server, via transceiver 114, that determine the operating mode of the controller. These instructions may establish the watchdog mode for sampling and transmitting data to the central server less frequently, or a fast mode for sampling and transmitting data more frequently. As will be described below the instructions establish one or more of the sampling interval, sampling frequency, transmission interval and transmission frequency to control the data collection and subsequent transmission to the central server.

In operation, sensor signals from sensors 106a, . . . 106n are sampled by sampler 107. The sampler samples the sensor signals during periodic sampling intervals at a predetermined sampling frequency, established by instructions sent from central server 120 to hub 104. In addition, system operators may provide instructions, via the central server, to the controller 110 to determine the local operating conditions of the cable system based on the signals provided by the sensors, and to establish the sampling interval and sampling frequency in accordance with the determined operating condition. The controller 110 also exercises control over transceiver 114 to transmit the sampled sensor signals to the central server within the transmission intervals at a predetermined transmission frequency. It may be advantageous and economical to control the transceiver based on a preferred or optimized transmission interval, as may be set by the network service provider, e.g. the cellular service provider, or as a function of the amount of data the service provider accommodates, as may be determined by communication traffic on the network.

In one embodiment, the sampled sensor signals are used by the controller 110 to determine particular operating conditions of the cable system and, in accordance therewith, to establish the transmission intervals and/or frequency at which the sampled sensor signals are transmitted. As will be described, successive transmission intervals are separated by a sleep interval, or sleep mode; and the controller is awakened to transmit the samples during an active operating mode, followed by a return to the sleep mode. Optionally, the sleep interval may be adjustable in response to instructions received from the central server.

Figure 2:
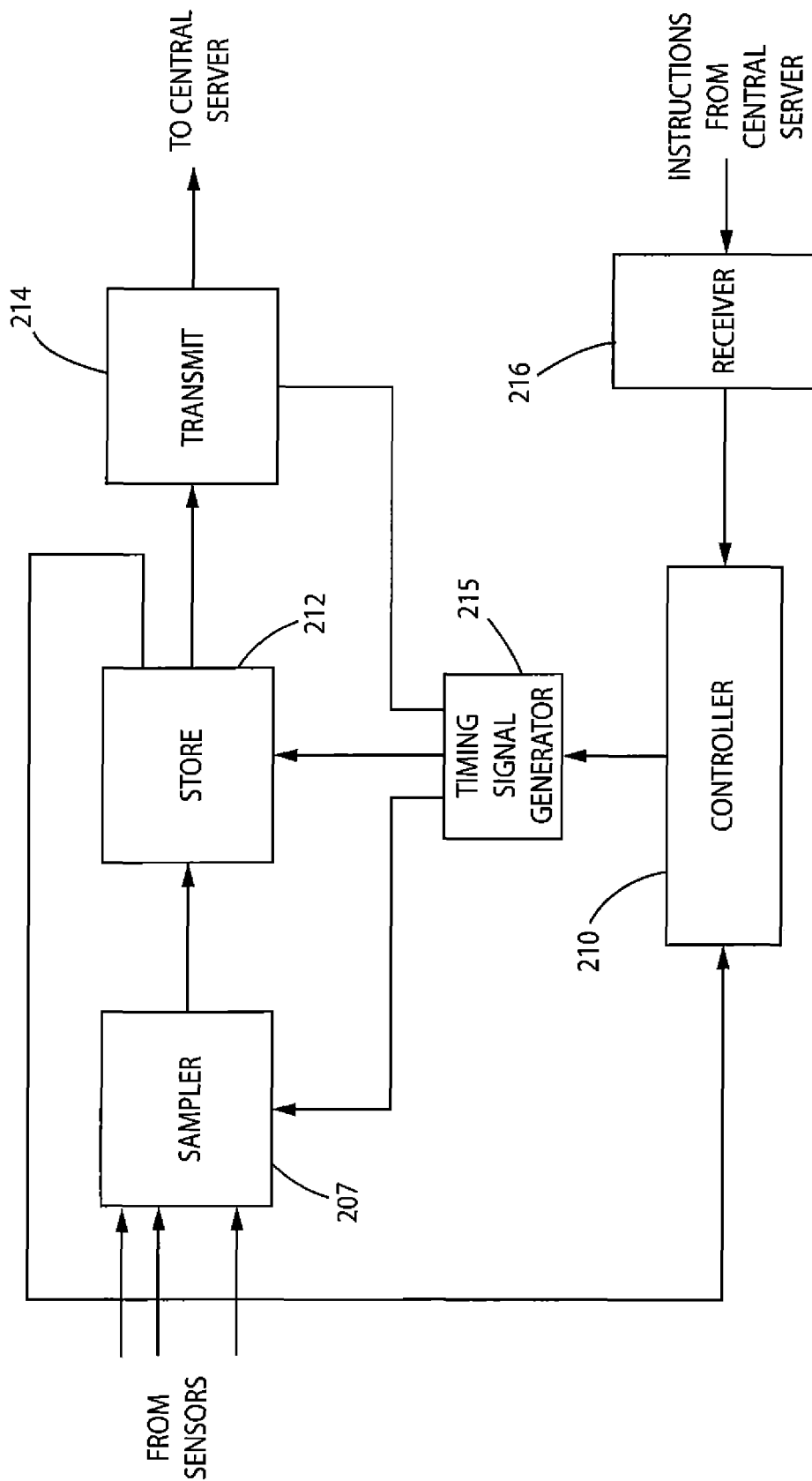
FIG. 2 is a block diagram of a portion of the hub illustrated in FIG. 1.

Turning to FIG. 2, there is illustrated a block diagram of portions of the electronics included within hub 104. Signals from the sensors 106a, . . . 106n are sampled by a front end, including sampler 207 operating at a determined sampling rate, analog-digital (A/D) converters and amplifiers (not separately shown) to produce digital samples. These samples are acquired during predetermined sampling intervals, preferably periodically at an adjustable sampling frequency, analyzed, packetized and stored in a memory 212. The packetized digital samples are read from the memory and transmitted as data packets by the transmitter 214 at scheduled, spaced apart transmission intervals to the central server 120. The transmitter 214 is included in transceiver 114. Preferably, the digital samples are subjected to data reduction before being packetized, as discussed below.

Timing signals which determine the sampling intervals, sampling frequency and transmission frequency are generated by a timing signal scheduler 215, which includes a clock under the control of a controller 210. The controller 210 includes a CPU that, inter alia, controls the timing signal generator 215, sampler 207 and transmitter 214. Instructions from the central server 120 (FIG. 1) are received by a receiver 216, which is included in transceiver 114. As will be described in connection with FIG. 3A, a transmission interval includes a leading portion which contains information to establish communication, e.g. a handshake or authentication, with the central server, a data portion which contains the packetized samples, and a trailing portion which contains instructions from the central server that establish the ongoing operating mode of the controller 210, for example the sampling interval, sampling frequency, transmission interval and transmission frequency of the timing signal scheduler. The trailing portion also may include "sign-off" information for terminating a communication session.

As mentioned, there are two principle modes of operation for the monitoring system. The watchdog or a low-speed mode is invoked when the cable system is behaving normally, that is, within the normal or historically expected operating range of the asset based on the experience of system operators or previously reported data (i.e. data samples that had been transmitted) containing no reported anomalies or deficiencies. In this watchdog mode, the sampling frequency may be slow since the amount of data to be acquired and reported to the central server is minimal and does not change significantly between sample acquisitions. The watchdog mode also is invoked when the hub initially is placed in operation, e.g. on startup, wherein there is no previous data to ascertain a "normal" or expected operating behavior. In one embodiment, technicians at terminal 124 may instruct moderate sampling and transmission frequencies to acquire data from which a reference operating behavior may be determined. The initial frequencies may be adjusted as needed or desired by the technicians.

The duration that hub 104 operates in the watchdog mode would typically be measured in weeks and months. The faster, or high-speed mode, is invoked to evaluate conditions that need a more complete examination, as when variations in the operating conditions of the cable system are determined automatously by the controller or by the central server; or when determined by technicians at terminal 124. The high-speed mode may be initiated to acquire signals that may otherwise have been missed during a long sleep interval of the sampler. For example, transient signals may be present during a sleep interval but would be observed and sampled in the high-speed mode. Examples giving rise to a transient signal include unexpected pressure transients in fluid circulation systems, as may occur because of unplanned valve closures. Other examples include breaches in containment, temperature increases due to equipment failure or fire or the like. In the high-speed mode, the sampling and transmission frequencies are higher. The duration of operation in the high speed mode typically is measured in hours or days as opposed to weeks or months. These modes of operation are further described below.

In operation, the controller 210 controls the timing signal scheduler 215 to execute sampling intervals, sampling frequencies, transmission intervals and transmission frequencies for acquiring and transmitting the digital samples based on instructions stored in the CPU memory or instructions received from the central server. The low speed, or watchdog mode, for example, is described below in connection with one example shown in FIG. 3A.

Figure 3A:
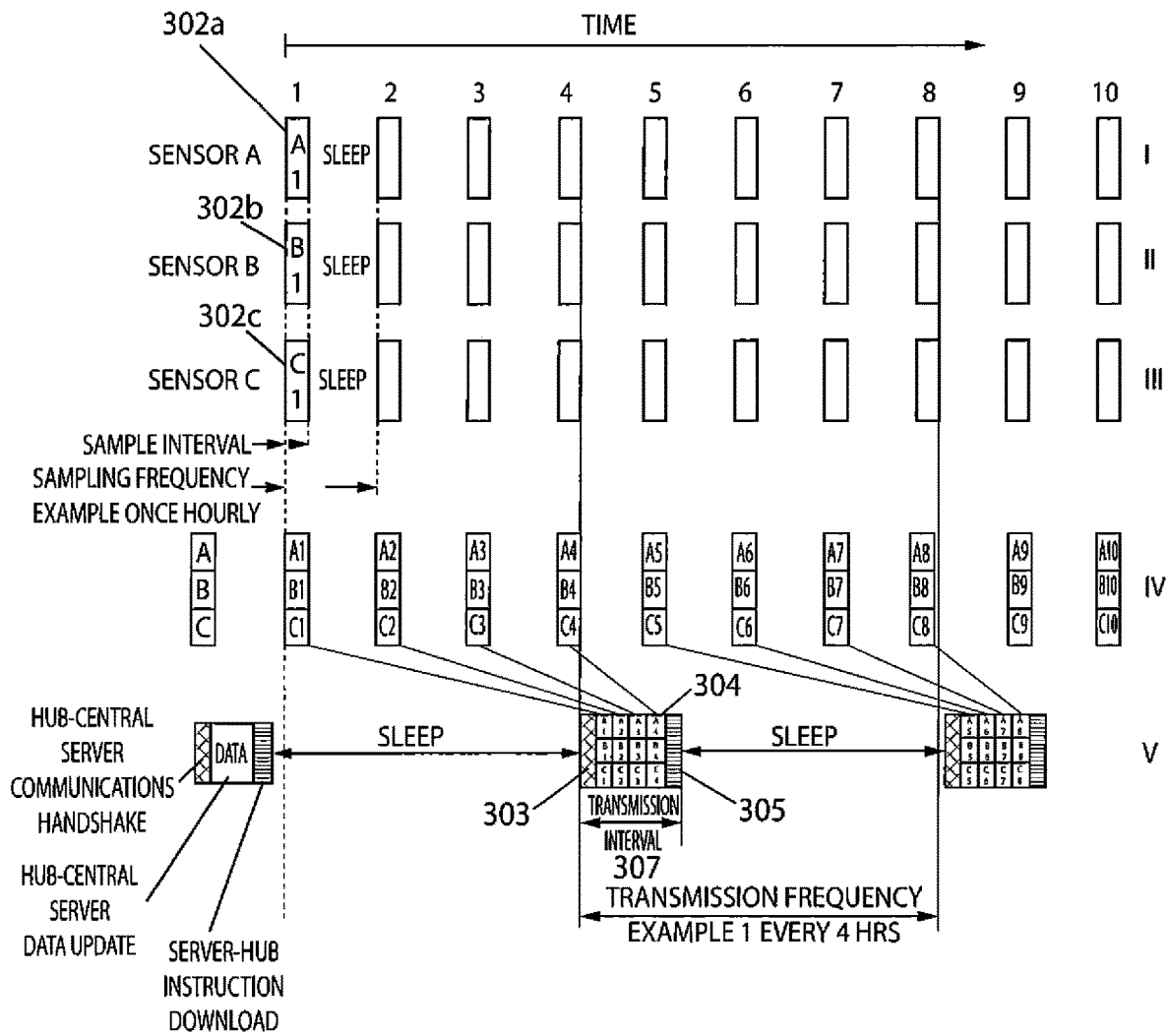
Figure 3B:
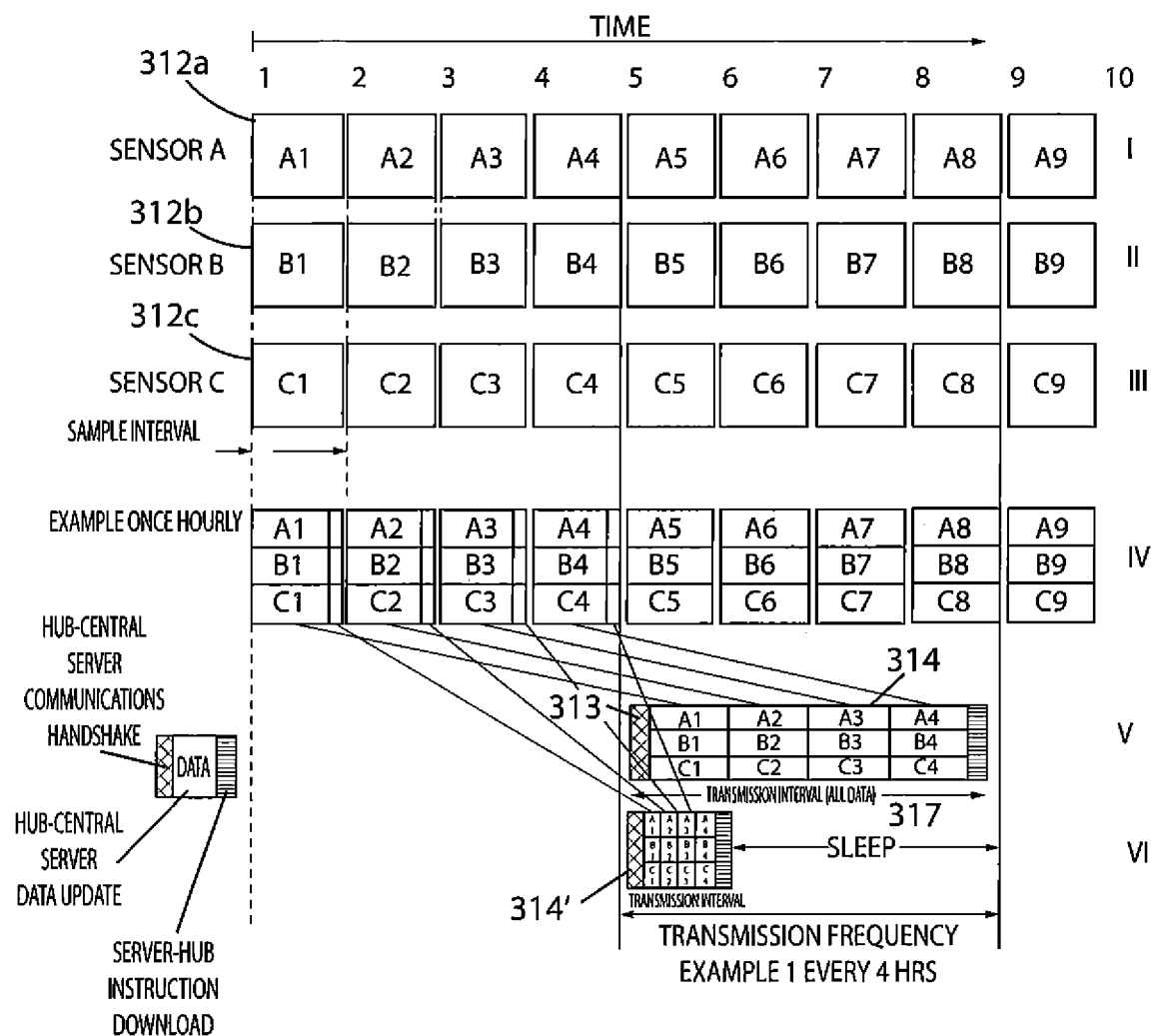
FIG. 3B is a timing diagram useful to explain another mode of operation of the hub.

In the high-speed mode, shown in FIG. 3B, the controller controls the timing signal scheduler to execute a longer sampling interval to acquire a greater number of samples. Accordingly, when operating in the high-speed operating mode of FIG. 3B with sampling and transmission frequency the same as in the low-speed mode of FIG. 3A, more data is acquired between transmission intervals and as such, the time required to transmit the data, i.e. the transmission intervals, will be longer. Generally, instructions received from the central server 120 determine the operating mode of the controller. These instructions may be provided by the asset managers or technicians based on preferred or specific monitoring objectives For example, vault temperatures along the route of the electric cable will depend on the number of circuits and individual cable loadings. The vault temperature is expected to vary daily due to changes in electric demand and seasonal due to demand and earth ambient temperature changes. High temperatures cause overloading of the cables. Nevertheless, temperature changes within the vault are expected to change slowly. Accordingly, a sampling interval of 1 minute, a sampling frequency of 1 sample/hour and a transmission frequency of once/day is a reasonable start. Environmental contamination or atmospheric conditions within a vault are expected to develop slowly. Accordingly, a sampling interval of 5 seconds, a sampling frequency of once every 30 minutes and a transmission frequency of once daily would be reasonable. For general cathodic protection measurements, a sample interval of 30 seconds, a sampling frequency of once every hour and a transmission frequency of once daily transmission would be reasonable. For specific cathodic protection tests that are scheduled hourly, a continuous sampling mode might consist of a 30 minute sampling interval performed once every hour and transmitted once every hour. In this "high speed" mode the controller would be instructed to return to the "watch dog" mode after 4 hours, conditions permitted. An asset manager may elect to cause the controller to operate in an adaptive monitoring mode wherein one or more of the sampling interval, sampling frequency, transmission interval and transmission frequency are changed automatically based on the signals from the sensors.

FIG. 3A is a timing diagram helpful in explaining the sampling of the sensor signals and the transmission of the sampled signals to the central server. For simplification, FIG. 3A illustrates the sampling and data transmission of the signals produced by sensor 106a, referred to as sensor A, sensor 106b, referred to as sensor B, and sensor 106c, referred to as sensor C. The sensor signals from sensors A, B and C are sampled during the sample interval illustrated in FIGS. 3A(I), 3A(II) and 3A(III). Sampler 107 may include individual sampling circuits, each operable at substantially the same time, to sample the signals produced by sensors A, B and C. Alternatively, sampler 107 may include a single sampling circuit, operable to sample at a high sampling rate, and in succession, the signals produced by sensors A, B and C. As illustrated, during a first time period, the sampled signals produced by sensors A, B and C are referred to as sample sets A1, B1 and C1, respectively. During a second time period, the sampled signals produced by sensors A, B and C are referred to as sample sets A2, B2 and C2. During successive time periods, the sampled signals produced by sensors A, B and C are referred to as sample sets A3, B3 and C3; sample sets A4, B4 and C4, and so on. The time interval between the successive sample sets produced during these time periods, that is, the time interval between sample sets A1 and A2, between sets B1 and B2 and between sets C1 and C2, is referred to as the sleep interval. Successive sample intervals are separated by successive sleep intervals. During the sleep interval, sampler 107 does not sample the sensor signals.

Controller 110 is adapted to packetize the sample sets A1, B1, C1; A2, B2, C2; A3, B3, C3; A4, B4, C4 and so on, (shown in FIG. 3(A)(IV)) and to assemble the packets into a common data package 304 in the transmission interval shown in FIG. 3(A)(V). In the example shown, controller 110 assembles one packet 302a, 302b, 302c, each packet containing 100 samples every hour from each sensor 106a, 106b, 106c, or 12 packets of 100 samples from all of these sensors once every 4 hours. In this example, all of the data packets are transmitted at the frequency of one transmission interval every 4 hours. One package containing the sample sets [A1, B1, C1], [A2, B2, C2], [A3, B3, C3], [A4, B4, C4] is transmitted during the transmission interval every 4 hours, as shown in FIG. 3(A)(V). If the sampling frequency is once per hour and the transmission frequency is one transmission interval every 12 hours, then 36 individual data packets, each containing 100 samples (or 3600 samples) are packaged and transmitted once every 12 hours. And if the transmission frequency is one transmission interval once a day (or once every 24 hours), then 72 data packets are assembled into a package of 7200 samples transmitted once a day.

Thus, the acquired samples of each of sets A, B and C, i.e. the assembled packages, are transmitted during each of the illustrated transmission intervals 304, and in the illustrated example, the transmission frequency is once every 4 hours (FIG. 3(A)(V)). The transmission interval typically is longer than the sampling interval, but for visual clarity in FIGS. 3A and 3B the sampling interval, during which the sensor signals are sampled and accumulated, and the transmission interval are shown to be similar.

Successive transmission intervals are separated by a sleep interval, during which the data packets are not transmitted. Inasmuch as the transmission of data requires more battery power, the operation of awakening the hub, and particularly the transceiver, for relatively brief periods relative to the sleep period serves to conserve battery power and prolong the life of battery 105. In this example, the transmission frequency (how often the transceiver is awakened), is adjustable and controlled by the controller. The transmission interval is determined primarily by the amount of information to be transmitted. The more information to be transmitted the longer the transmission interval. Consequently, the sleep period will vary accordingly. The transmission frequency, as shown in FIG. 3(A)(V), is controllable in accordance with the instructions sent to, or on-board, the CPU of the controller. In the embodiment illustrated in FIG. 3A, the transmission frequency is once every four hours. That is, the sampled sensor signals aggregated during one transmission interval 304 are transmitted once every four hours. The transmission interval may be adjustable in duration in one embodiment or in the amount of data aggregated therein in another embodiment.

The transmission interval may be thought of as being reduced if data samples from three time periods (rather than data samples form four time periods, as illustrated) are aggregated into one transmission interval. Likewise, the transmission interval may be thought of as being reduced if data samples from two sensors (rather than data samples from three sensors, as illustrated) are aggregated. Conversely, the transmission interval may be thought of as being increased if data samples from five time periods are aggregated into one transmission interval. And the transmission interval may be thought of as being increased if data samples from four sensors are aggregated. The numerical examples shown in FIG. 3A are illustrative; and a greater or lesser number of sensors, and a greater or lesser number of sample intervals to be aggregated may be used.

The sampling interval and sampling frequency may be adjustable in accordance with instructions from the central server or on-board the controller. The sleep interval between successive time periods and/or the sample interval may be adjusted to acquire more or less samples, as desired, for transmission to the central server.

In the embodiment illustrated in FIG. 3A, 100 samples are acquired during each sample interval, and the sample interval is on the order of 50 seconds. The sampling frequency acquires these 100 samples once each hour. Accordingly, 100 samples are acquired during this sampling interval every hour for each sensor. As will be described in connection with FIG. 3B, if more data is needed at the central server, as may be the case if the data sent to the central server indicates abnormal operation of the cable system, the sample interval and/or sampling frequency may be increased.

FIG. 3(A)(V) is an overview of the content of a typical transmission interval 307. The leading portion 303 of the transmission interval includes the overhead needed to establish the communication handshake between the hub 104 and the central server 120. This overhead may include identification of the hub, which identifies the vault and, thus, the location and type of the sensors along the cable system 102; authorization data, if needed; time of day; and so on. The trailing portion 305 of the transmission interval 307 includes a request to the central server for instructions to be download to the hub. The trailing portion also includes information for terminating the communication session between the central server and the hub. The data packets 304 are disposed between the leading and trailing portions of the transmission interval, as illustrated.

As mentioned, at least one of the sampling interval, sampling frequency transmission interval and transmission frequency are adjustable to establish different operating modes of the hub. As shown in FIG. 3A the sleep intervals interposed between the sample intervals and the transmission intervals are periods of controller and transmitter inactivity and these sleep intervals may also be adjusted. In the watchdog mode, the sampling interval and sampling frequency are reduced or the sleep interval is increased to limit the amount of data acquired and transmitted to preserve battery life. FIG. 3A illustrates a sampling frequency of once per hour and a transmission frequency of once every four hours. FIG. 3B is a timing diagram of the high-speed mode of operation of hub 104. In this example of a high-speed mode, the sampling interval shown in FIGS. 3(B)(I) to 3(B)(III) is almost one hour long; and the sampling frequency is assumed to be once per hour (as in FIG. 3A). Now, however, in the one hour sampling interval, 7200 samples of packets 312a, 312b and 312c of sets A, B and C, respectively, are acquired from each sensor 106a, 106b, 106c, respectively. The sampling interval is increased, on the order of about one hour, as compared to the sampling interval of FIG. 3A, which is on the order of about one minute. Accordingly, more samples (7200×3) are acquired in the sampling interval of FIG. 3(13), and more data is packaged to be transmitted. If 4 hours of samples are aggregated for transmission, then 7200×3×4=86,400 samples are transmitted every four hours. As a result, the transceiver effectively is continuously transmitting and does not sleep during the periods between sampling intervals, thereby consuming a greater amount of energy. Accordingly, it is preferred to limit the duration of hub operation in the high speed mode to preserve battery life.

In one embodiment, instructions from the central server, as may be provided by a technician at terminal 124, may cause the controller to control at least one of the sampling interval, the sampling frequency and the transmission frequency for data derived from one or two isolated sensors. In another embodiment, the controller may be preset to sample a predetermined parameter, such as the parameter detected by sensor 106a, more frequently than other detected parameters. For example, the controller may control the sampler 107 to sample the signal from sensor 106a more frequently than the signals from the other sensors. Accordingly, high speed operation may be invoked upon just one sensor, such as sensor 106a, at any specific time, such as when only one parameter needs to be monitored in high speed mode.

As described below, in a preferred embodiment, the sample data is statistically reduced to a subset of sample values that are representative of the acquired sample values. FIG. 3(B)(VI) shows the size of the data packets [A1, B1, C1], [A2, B2, C2], . . . is reduced, as will be described below, such that the transmission interval 314' is reduced. Consequently, the transceiver sleeps during the periods between transmission intervals.

The CPU of controller 210 includes a memory for storing instructions, including start-up instructions to operate the CPU in a startup mode, such as a boot mode to establish initial communication with the central server when power first is supplied to the hub. In one embodiment, the CPU operates in a recovery mode in the event power to the hub is lost and subsequently restored, or in the event communication between the hub and the central server is lost and subsequently re-established. When power is restored, or when communication is re-established, the controller reads from its memory pre-set recovery instructions and transmits to the central server status information of the hub, including the number of data packets stored in memory 212 that might have been assembled from sensor signals but had not yet been transmitted to the central server. Typically, the LP-WAN protocol tracks successful transmission of data packets. Accordingly, in this recovery mode, the hub transmits those stored data packets that had not been transmitted successfully to the central server; and the central server transmits instructions to the hub to update the sampling intervals and sampling frequency for sampling the sensor signals and to establish the transmission frequency at which the data packets are transmitted to the central server.

In the preferred embodiment, store 112 in hub 104 stores the data that is transmitted to the central server. As more data is transmitted, the data stored in store 112 is updated. However, as noted above, in the event of a communication loss, the data stored in store 112 might be updated but might not accurately reflect the data that had been sent to and received by the central server prior to such loss. Accordingly, at the beginning of a transmission interval, a comparison is made between the data stored in store 112 and the data that had last been transmitted to, and received by, the central server. In the event of a discrepancy therebetween, at least some of the data stored in store 112 is retransmitted to update the central server to conform to the data retained in store 112.

As described below, to conserve energy and reduce battery consumption, each packet of data may be reduced in size and does not contain the original 100 (or 7200) sample values. Rather, for each set of samples A, B, C, statistically derived values representative of the sample values are transmitted. It has been found, the operation of the asset, or cable system, can often be satisfactorily monitored by as few as 5 statistically derived values representative of the larger set of samples. For greater accuracy in analyzing the acquired data; and alternatively, depending upon the parameter(s) being monitored, a greater number of values, but less than the values in the set of samples, may be transmitted. This is a significant reduction in the amount of data transmitted from the hub, resulting in advantageous energy conservation, thereby prolonging the operating life of the battery, reducing data storage requirements, reducing transmission time and simplifying analysis.

The instructions that determine the high-speed or low-speed (i.e. watchdog) operating modes of the controller are established initially by system technicians at, for example, terminal 124, and sent to hub 104 from the central server. These instructions are based on the knowledge and experience of the system technicians and asset managers and may be changed, depending upon the sensed behavior of the cable system. In practice the sampling and transmission frequencies will depend on how closely the asset managers wish to monitor the asset. In one example of the low-speed watchdog mode, 50 samples of the signals from a sensor, such as sensor 106a, are acquired once every hour and transmitted once every day. In the high-speed mode, signals from the sensor are sampled and transmitted substantially continuously (as shown in FIG. 3B), for example, for two days. In this high-speed mode of operation, subtle changes in system behavior are revealed, permitting closer scrutiny of any abnormalities. With growing operating experience, asset managers can establish default conditions for these basic operating modes.

If, in response to the monitored parameters represented by the monitored sensor signals, the central server or the technician at the central server, detects a condition that requires more frequent examination, such as deviations from the expected operating behavior of the cable system, or a condition that anticipates a fault, the instructions sent by the central server cause the controller 110 to increase the sampling and/or transmission frequencies; and to return to original or default instructions when the operating behavior stabilizes or returns to its expected behavior.

In addition to executing the instructions sent from the central server, the controller 110 can modify its operating mode independently of the central server under some predetermined conditions. For example, the most recent sample data placed in store 212 of FIG. 2, which represents the most recent sampled sensor signals, is compared by the controller 210 to the previous sample data in store 212. As a result, if the sample data changes rapidly or significantly over a predetermined period, changes in the behavior of the cable system may be detected at the hub before being determined at the central server because the data would have not yet been transmitted to the central server. For example, if the sample values for a particular sensor, e.g. sensor 106a, changes significantly from one sample to the next and if the rate of change in these values exceeds a predetermined threshold, the controller increases at least one of its sampling interval, sampling frequency, transmission interval and transmission frequency. The particular frequency at which the samples are acquired and/or the particular transmission frequency of the data packets (i.e. how often the data packets are transmitted) may be selected as a function of this rate of change. Conversely, if the data stored in store 212 changes slowly over a pre-set period of time, for example, if the rate of change is less than a particular threshold, the controller may reduce its sampling interval, sampling frequency, transmission interval and transmission frequency. This change in the operating mode may be gradual over time.

As mentioned above, power consumption is reduced by reducing the amount of data transmitted during each transmission interval when the transceiver wakes up and is active. Although different data compression techniques may be used, it is preferred to reduce the size of the data packets, i.e. to reduce the amount of data in each data packet. The manner in which the data is reduced for transmission to the central server is described in accordance with one technique shown in FIG. 4, which represents the samples obtained in sets A, B and C of FIGS. 3A and 3B. It is assumed that each of sets A, B and C contains 100 samples of the sensor signals produced by sensors 106a, 106b, 106c, respectively; and the values of these samples are shown in the order of occurrence, or sampling, in FIG. 4A. For example, in set A, the first sample of the signal from sensor 106a has the value 45, the second sample of the signal from sensor 106a has the value 47, the third sample has the value 37, and so on. Each value may be a voltage level, as in millivolts, or a value representing units of current, temperature, pressure, or other parameter detected by the sensor 106a. Likewise, in set B, the first sample of the signal from sensor 106b has the value 45, the second sample of the signal from sensor 106b has the value 47, the third sample has the value 22, and so on. The sample values for the samples from sensor 106c acquired in set C are as illustrated in FIG. 4A.

Although a variety of statistical tools are available to accomplish this objective a more robust technique is applied by calculating five characteristic values from the empirical distribution function derived from the data collected for that period, as now described. The controller 210 reorders the sample values in each set A, B, C from lowest to highest. In the example in FIG. 4B, the lowest sample value in set A is 35 and the highest sample value in this set is 60. Likewise the lowest and highest sample values in each of sets B and C are as illustrated.

FIG. 4C illustrates the median or 50th percentile sample value in each set. The median values are shown as 44 for the samples in set A, 44 for the samples in set B and 32 for the samples in set C. The sample value at the first quartile, which corresponds to the 25th percentile level in each set of re-ordered samples acquired in each sample interval is 39 for set A, 37 for set B and 31 for set C. The sample value at the third quartile, which corresponds to the 75th percentile in each set of re-ordered samples acquired in each sample interval is 47 for set A, 51 for set B and 39 for set C. It has been found that these five sample values, namely, minimum, maximum, median, first quartile and third quartile values, provide sufficient data for the central server to properly characterize and monitor the cable system and identify changes in the cable system operating behavior. By reducing 100 sample values in a set to 5 values, power consumption of the hub and particularly power consumption due to data transmission is markedly reduced.

The five sample values acquired during each sample interval, namely, the minimum sample value, the maximum sample value, the median sample value and the sample values obtained at the first quartile and the third quartile for each set, are transmitted as the packet of digitized data representing all the samples acquired during the sampling interval. This data reduction technique can be employed for both high-speed and low-speed (e.g. watchdog) operations.

As discussed above, the data packets of each set are assembled into a package (FIGS. 3A and 3B) and the packages are transmitted during each transmission interval. This data is collected with data packages from other hubs and analyzed at the central server to represent the characteristic behavior of the cable system. If this behavior does not change over a period of time by more than a predetermined threshold, the central server determines the cable system is operating properly and no faults or alarm conditions are detected or anticipated. Consequently, it is sufficient to acquire and transmit these data packets at a relatively lower frequency, for example one package every 8 or 12 or 24 hours, or more infrequently, resulting in lower power consumption. However, if the central server (or technician) determines that the sensor signals should be examined more frequently, as when the data represented by the packets changes over a period of time by more than a threshold, the controller 210 is instructed to cause more packets to be transmitted, such as shown in FIGS. 3B(V) and 3B(VI), as by increasing the sampling interval, the sampling frequency, the transmission interval and/or the transmission frequency. Accordingly, when operating in a higher speed mode more data is collected and the central server is enabled to examine the operating characteristics of the cable system more closely, that is, more frequently; but at the cost of higher power consumption.

Likewise, if the controller determines that the data packets of the five representative samples of the sets that are acquired changes historically by more than a predetermined threshold, or if the data in those data packets changes historically at a rate of change greater than a predetermined amount, the controller may cause more data to be acquired and the data packets to be transmitted more frequently.

Comparison of the statistically reduced sample data to historical data may be used to adjust the sampling and transmission frequencies of the hub (or hubs). This comparison can be made at the hub, where data from different sensors within the hub is available for comparison, or at the central server which collects data from different hubs distributed along the route traveled by the cable system. The controller 110 of hub 104 may operate in a self-adaptive mode, discussed below, or may respond to suitable instructions from the central server, to compare the sampled signals from one sensor, such as sensor 106a, to the sampled signals from another sensor, such as sensor 106c, to adjust the sampling interval, the sampling frequency, the transmission interval and/or the transmission frequency of the data sent from one of these sensors in the event of a significant difference between the sampled sensor signals. Similarly, the controller may change the sampling interval, the sampling frequency, the transmission interval and/or the transmission frequency of the data sent from, for example, sensor 106b if the sampled sensor signals from sensor 106b changes rapidly.

Figure 5:
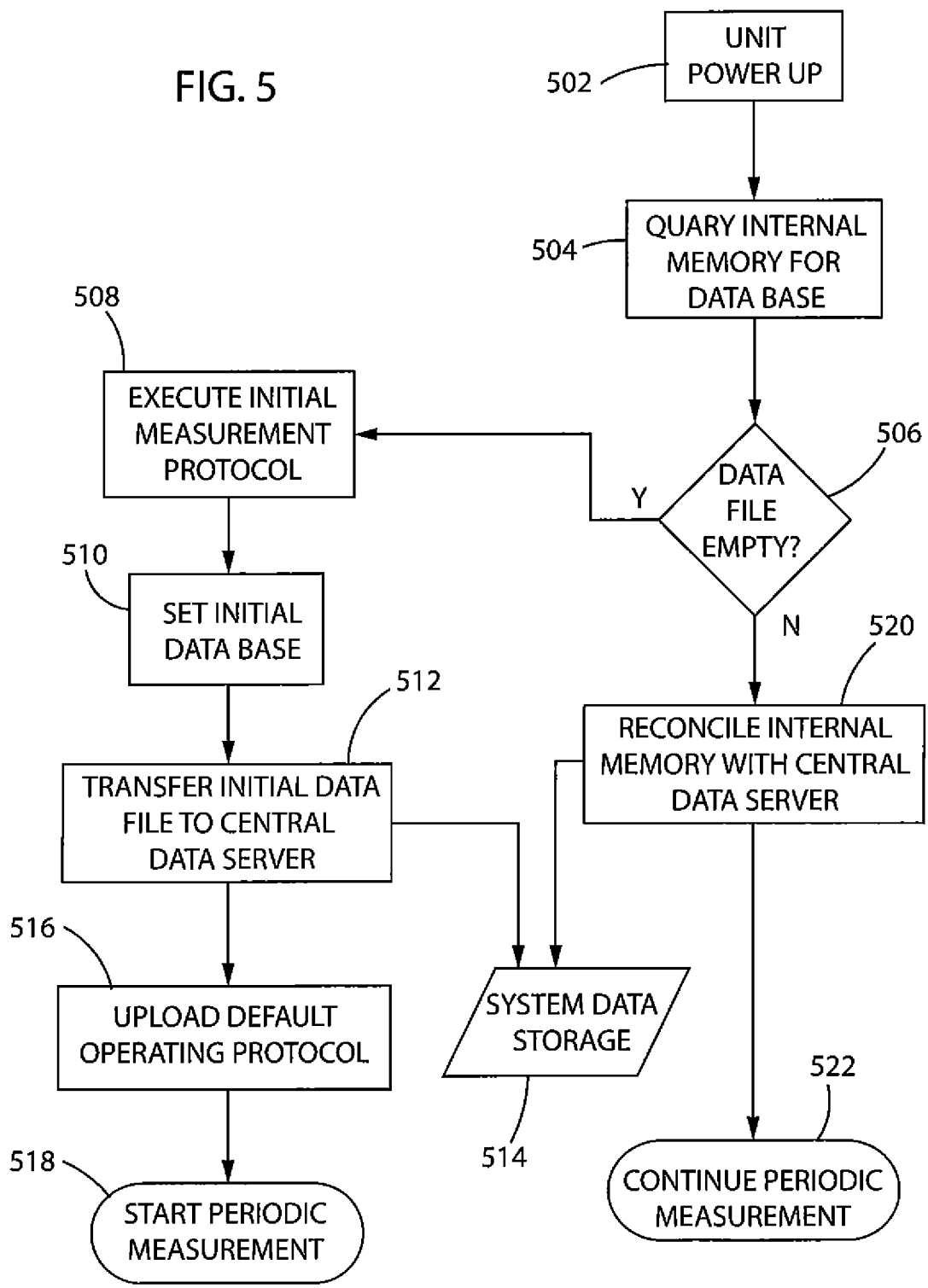
FIG. 5 is a flow chart illustrating the initialization of the system.

Turning to FIG. 5, there is illustrated a flow chart representing the initialization of the hub 104, as when the hub is first installed or commissioned. When the hub 104 powers up, that is, when power first is applied to controller 110, represented by step 502, operation proceeds to step 504 to read operating instructions from a suitable file in store 112. If, at query 506, it is determined the file is empty, as is expected at start-up, the operation proceeds to step 508 which acquires initial data by sampling the signals from sensors 106. This initial data is stored in store 112, as at step 510, and at step 512 this initial data is transmitted to the central server 120, the hub is authenticated and hub identification data is stored, as represented at 514. The protocol for monitoring the signals produced by sensors 106 is acquired, or uploaded, from the central server at the trailing portion 305 of the initial transmission interval. Sensor sample acquisition, or periodic measurements of the cable system parameters being monitored, then commences in accordance with the instructions sent from the central server, as represented by step 518.

Initial operating instructions for hub 104 are stored in store 112. These instructions may be updated with instructions from the central server, sent during the trailing portion 305 of a transmission interval. These instructions may be thought of as recovery, or default instructions, to control the operation of the hub in the event power or communication is restored, as mentioned above.

In the event query 506 is answered in the negative, that is, the designated file in store 112 is not empty, as may be the case following the loss and subsequent restoration of power or communication, the process advances to step 520. Step 520 operates to reconcile the data in store 112 with the data that had been transmitted to the central server. It will be recalled, when power or communication is re-established after an interruption, data that had been acquired at the hub might not have been successfully transmitted to the central server. For example, interruptions in communication may occur while the hub is in its sleep mode, or interruptions may be attributed to the LP-WAN network. Nevertheless, with local power still present, parameter sensing and data packaging will continue, notwithstanding the interruption in communication. When communication is restored, the data stored in store 112 will be reconciled with the data stored at the central server; and data packages that were not previously sent to the central server will be transmitted. Accordingly, step 520 serves to send to the central server the data that had been last acquired, as represented by 514. Thereafter, the hub continues to sample the sensor signals and send the data packets representing the sampled sensor signals to the central server, as described above.

Figure 6:
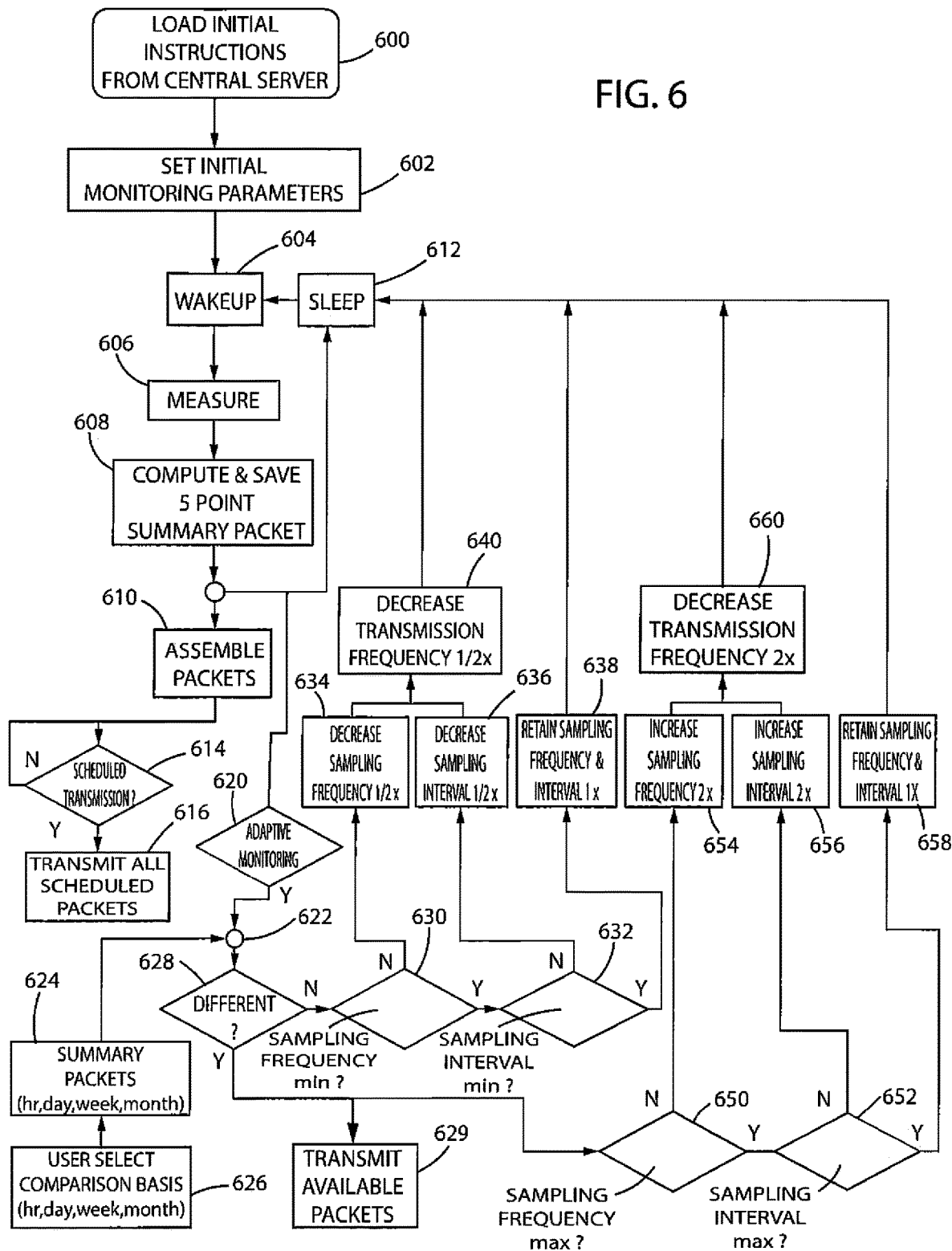
FIG. 6 is a flow chart illustrating default operation of the system.

Referring now to FIG. 6, there is illustrated a flow chart representing the operation of the hub in an adaptive sampling and transmission mode. In the adaptive operating mode, controller 110 adjusts one or more of the sampling interval and the sampling and transmission frequencies in response to certain changes in the parameters of the cable system monitored at the hub location. The flow chart begins with operating the system in the watchdog mode with instructions received from the central server in step 600 and the hub configured for normal monitoring represented by step 602. As discussed in connection with FIGS. 3A and 3B, the hub (more particularly, the controller) wakes up periodically from its sleep mode, as represented by step 604. The sampler 107, under the control of the controller, samples the sensor signals during the sample interval at the sampling frequency discussed in connection with FIG. 3A. Accordingly, the sensor signals are sampled, or measured, at step 606. In the watchdog mode, for example, the signals produced by each sensor are sampled 100 times during the sample interval. At step 608, the controller reduces the amount of data from 100 samples to 5 sample values, as discussed above in connection with FIG. 4. These sample values are packetized and stored as packages for transmission in step 610. As shown in the flow chart, the process cycles through wake up 604, sampling 606, data reduction 608 and sleep 612. The data packages that are assembled and stored at 610 are transmitted at scheduled times, at predetermined, transmission frequencies, in accordance with the instructions received in step 600, to the central server as represented by steps 614 and 616.

If the hub has been configured by previous instructions from the central server to operate in the adaptive monitoring mode, query 620 is answered in the affirmative; and the hub operates to modify the sample interval, sampling frequency and transmission frequency automatically, within a pre-set range based on the application requirements and monitoring equipment limitations. Monitoring in the adaptive mode optimizes battery life without sacrificing meaningful data. In this adaptive monitoring mode, the most recently acquired packet from step 608 is compared, in step 622, to the preceding packets that had been stored in step 624 to determine differences therebetween. As represented by step 626, the preceding packets to which the most recently acquired packet is compared is selected in accordance with the pre-set decision of whether the preceding packets are those packets that had been acquired in the last hour or day or week or month, or any other desired time period. If there is no appreciable difference, query 628 is answered in the negative and the process proceeds to step 630 where the present sampling frequency, that is the frequency at which the most recent sensor signals are sampled, is compared to the minimum desired sampling frequency (set by system operators).

If the present sampling frequency is not at the minimum sampling frequency, query 630 is answered in the negative and the sampling frequency at which sampler 107 (or 207) operates is reduced in step 634. In this example, the sampling frequency is reduced by one-half. However, if the present sampling frequency is already at the minimum sampling frequency, query 630 is answered in the affirmative and query 632 asks if the present sampling interval is at the minimum desired sampling interval (set by system operators). If query 632 is answered in the affirmative, no change in the sampling interval is made and the hub continues to operate using the present sampling frequency and sampling interval, at step 638, which are the slowest desired monitoring parameters. However, if query 632 is answered in the negative, and the sampling interval at which sampler 107 (or 207) operates is reduced in step 636. In this example, the sampling interval is reduced by one-half. Where changes in sample interval or sampling frequency are made in step 634 or step 636, the transmission frequency is similarly reduced in step 640. Reduction in the sampling frequency, sampling interval and transmission frequency to conserves energy.

However, if query 628 is answered in the affirmative, as when there are appreciable differences between the most recent data packet 608 to the preceding packets 624, query 650 asks if the present in sampling frequency is at the maximum sampling frequency. If query 650 is answered in the negative, the sampling frequency is increased at step 654. In this example, the sampling frequency is increased by a factor of two, although other frequency increases may be used. If query 650 is answered in the affirmative, query 652 asks if the present sampling interval is at the maximum sampling interval. If query 652 is answered in the negative, the sampling interval is increased at step 656. In this example, the sampling interval is increased by a factor of two. Where increases in the sampling interval or sampling frequency are made in step 654 or step 656, the transmission frequency is similarly increased in step 660. If query 652 is answered in the affirmative, no change in the sampling interval is made and the hub continues to operate using the present maximum sampling frequency and maximum sampling interval, at step 658.

The increase in the sampling frequency 654, the sampling interval 656 and transmission frequency 660 results in sampling the monitored parameters more regularly, as would be desired where sensor signals are subject to greater variability or the cable system exhibits abnormal behavior. This increases the amount of data transmitted to the central server to improve analysis at the expense of battery life. Battery conservation suggests setting constraints on the sampling intervals and sampling frequency in the adaptive operating mode. Subsequent additional analysis of the monitored parameters also is possible by operating the hub in high speed-continuous sampling mode for a brief period. Continuous monitoring and transmission of sensor signals can be achieved simply by setting the sampling interval substantially equal to the sampling frequency.

Any logical test can be used in query 628 to determine whether there is an appreciable difference between the most recently acquired data packet and preceding packets stored in memory 112. The stored preceding packets are historical references and the historical references can be updated continuously by setting a fixed storage file size and deleting from this file the earliest acquired data packet to make room for the most recent acquired data packet. The appreciable difference test can be whether the difference exceeds a specific change in value; such as greater than 10%, or a specific deviation value such as 2 or 10 scaler units. The choice of the comparative test for determining the appreciable difference may depend on the parameters being sensed and tolerances or sensitivity allowed in a condition assessment for the asset.

It will be appreciated, the hub is awakened from its sleep mode (step 604) to acquire samples of the sensor signals and to transmit the acquired sample values periodically, as represented by FIGS. 3(A)(I)-3(A)(V); and as represented by FIGS. 3(B)(I)-3(B)(V). Sampler 107 enters its sleep mode after the sensor signals are sampled during the sample interval. Transceiver 114 enters its sleep mode after the data packets are transmitted. In the adaptive monitoring mode, the durations of the respective sleep intervals, sample intervals and transmission intervals are set as discussed above in connection with FIG. 6. Other operating modes of the hub are established by the instructions received from the central server.

Figure 7A:
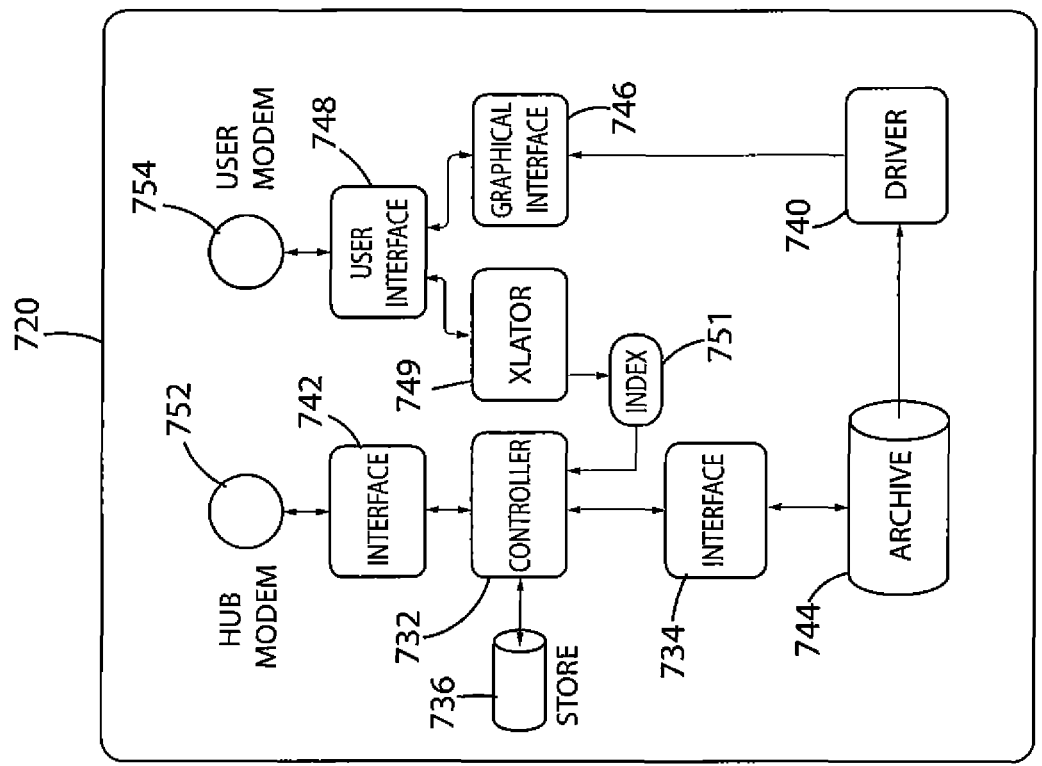
FIGS. 7A-7B constitute a block diagram of an embodiment of the remote monitoring system provided with several hubs.
Figure 7A:
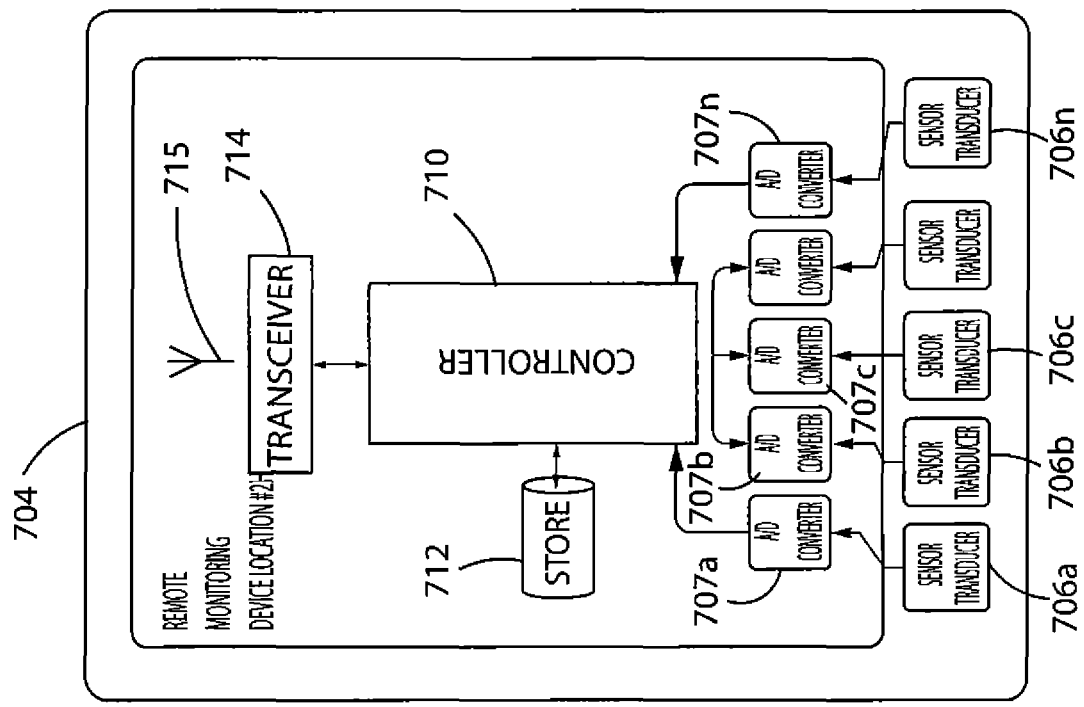
Figure 7B:
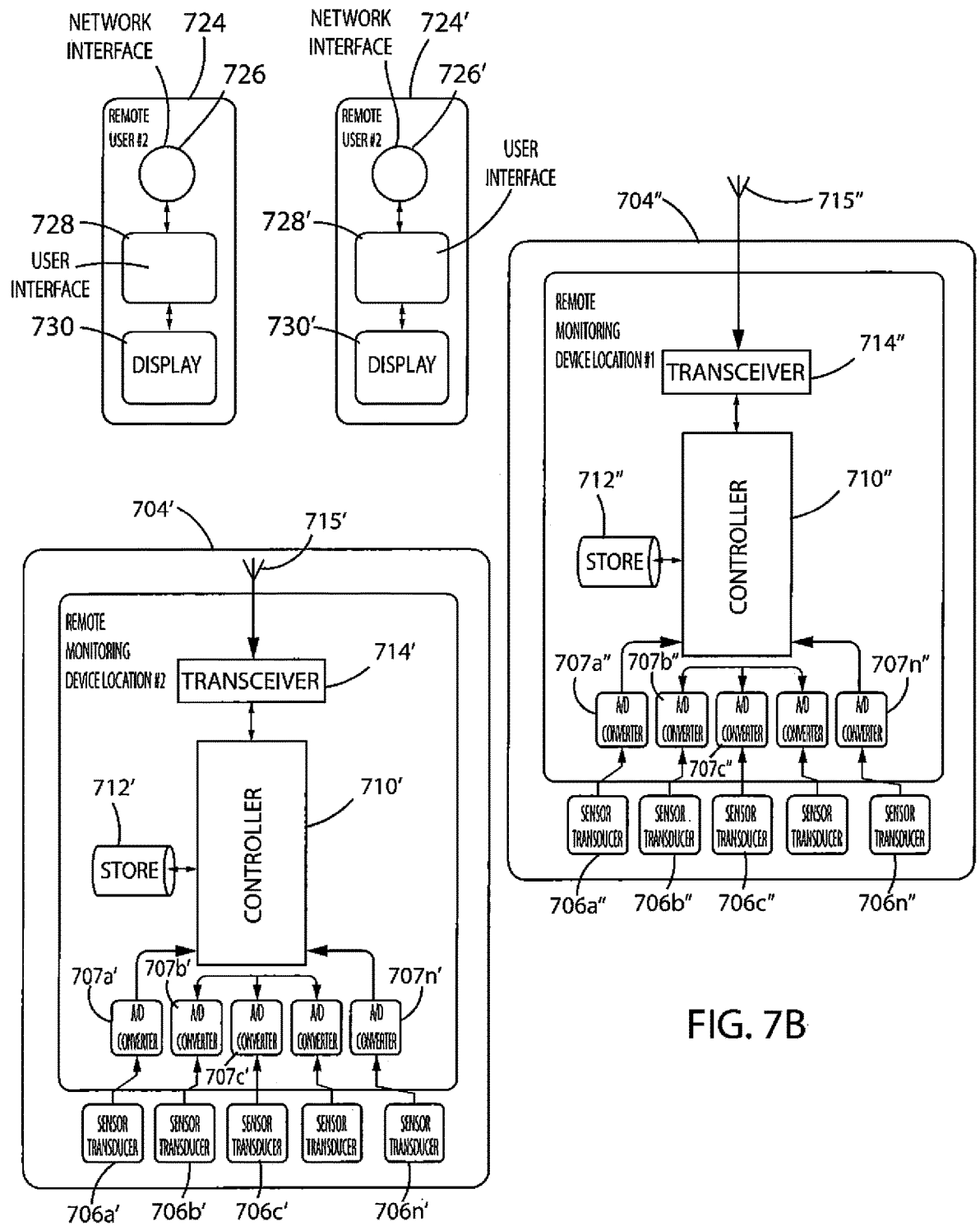

The remote monitoring system of the present invention is operable with several underground hubs. One embodiment of such a system is illustrated in FIGS. 7A-7B. The system is comprised of a central server 720 (FIG. 7A), terminals 724, 724'(FIG. 7B), which may be management terminals, similar to terminals 124 of FIG. 1, and plural hubs 704, 704' and 704" shown in FIGS. 7A and 7B. It will be appreciated, a greater or lesser number of hubs may be provided; and a greater or lesser number of terminals may be provided. Each of hubs 704, 704', 704" is similar to hub 104. For simplicity, the following discussion is directed to hub 704; but it will be understood, this discussion is applicable to hubs 704' and 704" as well.

Hub 704 is adapted to be located within an underground vault or manhole, as is the case with hub 104, and is comprised of A/D converters 707a, 707b, . . . 707n. These A/D converters function to sample the signals from transducers 706a, 706b, . . . 706n and are similar to sampler 107 of FIG. 1. Hub 704 includes a controller 710, similar to controller 110 of FIG. 1; and a store 712, similar to store 112 of FIG. 1. Hub 704 further includes a transceiver 714, similar to transceiver 114 of FIG. 1. Transceiver 714 is coupled to an antenna 715 which is disposed within the hub enclosure. Hub 704 operates in the same manner as hub 104; and in the interest of brevity, further description of the operation of hub 704 is omitted.

Hub 704' is similar to hub 704; but differs from hub 704 by disposing antenna 715', which is coupled to transceiver 714', outside the hub enclosure but within the underground vault or manhole in which hub 704' is located.

Likewise, hub 704" is similar to hub 704; but differs from hub 704 by disposing antenna 715", which is coupled to transceiver 714", outside the hub enclosure and outside the underground vault. Antenna 715" may be located underground or above ground.

Hubs 704, 704' and 704" are constructed in substantially the same way as hub 104 and operate the same way as hub 104. Data is sent from the hubs to the central server 720. The central server processes the data, which represents conditions sensed by the hubs at different locations of the cable system, or asset, to monitor the conditions of the asset and thereby characterize the behavior of the asset. The central server also translates, or converts, operating instructions received from terminal 724 and/or terminal 724' into a form, format and language (e.g. machine language) compatible with the hubs. As one embodiment, the central server includes a controller 732, the functions of which are shown more particularly in the flow chart of FIG. 7C, an interface 734, a store 736, an interface 742, an archive 744, a graphical interface 746, a user interface 748, a hub modem 752 and a user modem 754.

Hub modem 752 is adapted to receive the data transmitted by hubs 704, 704', 704" and to transmit instructions to these hubs from interface 742 via LP-WAN communication. These instructions are used by the hubs to establish one or more of the sampling frequency, sampling interval and transmission frequency for acquiring and transmitting sensor signal samples, as discussed above.

Controller 732 processes the data representing the monitored parameters of the asset. When the asset operates as expected, the controller 732 sends instructions via interface 742 and hub modem 752 to the hubs to continue operating in their respective watchdog modes. However, if it is determined that the asset is operating in a manner that differs from expected or normal behavior, instructions from terminal 724 or 724' in, for example, the "language" used at the terminals by the technicians, are converted, or translated by translator 749 to machine language compatible with the hubs. The address of the particular hub for which the instructions are to be sent, such as the IP address of the hub, is appended to, or made part of, the instructions by index 751, which converts the identification of the hub, as provided by the technicians at terminal 724 or 724', to the hub address (e.g. the IP address). As discussed above, these instructions are sent to the addressed hubs to adjust the transmission frequency, sampling interval and/or the sampling frequency of that hub. Accordingly, data is sent more or less frequently to the central server for analysis, as needed.

User modem 754 is adapted to communicate with terminals 724, 724' via a network, such as a cellular network. Information from the central server is sent, via the network, to these terminals to permit technicians, or asset managers, at the terminals to observe the behavior of the asset being monitored. The terminals 724, 724' are furnished with information in accordance with the data supplied from the hubs. Controller 732 supplies this data, received by hub modem 752, converted into the language compatible with terminals 724, 724', through interface 734 to archive 744 whereat the data is stored together with the address, or identification, of the hub that transmitted the data. The archived data is associated with the corresponding hub by driver 740 and is used by graphical interface 746 to generate graphical representations displayed as a dashboard at the terminals, which enable asset managers to understand the behavior of the asset. Remedial or other action may be instructed by the asset managers, based on the information sent to the terminals 724, 724'.

Advantageously, central server 720 includes two distinct communication paths: one path to communicate with the remote hubs and receive data representing the parameters of the asset being monitored; and the other path communicating with the management or system user terminals 724, 724' to provide the asset managers with information sufficient to characterize the operation of the asset. As shown in FIG. 7B, each management terminal includes a network interface 726, 726' for communicating with the central server 720, a user interface 728, 728' and a display 730, 730'. Information from the central server is displayed on display 730, 730'; and the asset manager may access the display and the information displayed thereon via interface 728, 728'. One example of the displayed information is the so-called "box and whisker" display by which the asset manager may observe the behavior of the asset.

Each management terminal may be a work station, a computer terminal, a tablet, a smartphone, a PDA, or the like. The network interface 726, 726' may be connected via hard-wire to the central server 720. Alternatively, the network interface is a wireless connection, such as a cellular connection.

FIG. 7C is a flow chart representing the relevant operation of controller 732 of the central server. The purpose of the central server is to provide a human/machine interface to send operating instructions to local hubs via the communications network 122 and to receive information and data from the hubs via the communications network. The controller serves to extract the individual data packets from the data package transmitted from the hubs, to convert the raw data in the received data packets to meaningful engineering values and to save the data to an allocated asset identifiable file where the data subsequently can be retrieved, analyzed and flagged for subsequent review by the technicians at terminals 724, 724'.

Referring to the flow chart of FIG. 7C, hub information pertaining to the physical and electronic address of each hub, the asset identifier to identify the asset as, for example, an electric cable, a pipeline, or the like, the parameter(s) to be monitored, such as temperature, moisture, voltage, current, etc., and the equations and algorithms to be used for converting raw data measured by the sensors to useful engineering units are entered by technician(s) from, for example, terminal 724, as represented by step 760. To assure security and authorization, information from the technician is entered using passwords or other secure methods of limiting control access to the server to authorized personnel. Similarly, instructions that set the operating mode, sampling interval, sampling frequency and transmission frequency for the remote monitoring hub(s) are entered by authorized personnel, automatically translated to machine instructions in a form, format and language compatible with the hubs; together with an address identifying the corresponding hub to which the instructions are to be sent, at step 762 and transmitted at step 776 to the hubs.

Data packages from the hub(s) are received at step 764 and the hub from which the package was sent is identified and added to, or tagged to the data package at step 766. The sample data within the received package is extracted and separated at step 768 into constituent parts including environment information common to all assets within the manhole and environment conditions pertaining to the hub itself 704; and another part representing the sensor signals monitored by the specific hub. The extracted environment information, such as local temperature, battery life, time of last transmission from the hub, and so on, is placed in files and stored at step 770 which is common to all sensors attached to the hub. The tagged sample data is saved at step 774, which stores files specific to the asset and parameters being measured. For example, sample data from the same sensor is stored in a file associated with that sensor. Partitioning in this manner retains original data for future analysis independent of scaling and calibration factors that might be applied after transforming the data to meaningful engineering units, as represented by step 778. The transformed data from step 778 is time stamped and saved to an engineering data file, or database, 780 for use in historical trending, analysis and alarm notifications. This data can be accessed by all system users from computers, tablets, smart phones, etc., having suitable software. After the sample data is saved, operating instruction to the hub are transmitted at step 776. The instructions may be modified, depending upon the sample data that has been extracted. Prior to disconnecting from the hub, the central server sends updated operating instructions 776 based on scheduled updates received from the technician at step 762.

The transformed data from step 778 is compared at step 781 with previously saved data saved at step 780 to generate alerts, alarms and the like. The comparison may be based on absolute values, percentage change, statistical shifts based on daily, weekly or monthly statistics, or rate of change information that can be acquired from the updated data base 780. The criteria used for comparison may be as described in connection with FIG. 6 and may be assigned by the operating engineers or technicians at terminal 724, 724' and uploaded from modem 754. Query 786 asks if the comparison requires a message or notification to be sent to the technician at, for example, terminal 724. If query 786 is answered in the affirmative, the message or notification is sent at step 782 to the technician via the modem 754. Messages may be sent to system operators via one or multiple paths 726.

Advantageously, the technicians at, for example, terminal 724, have access to the data received from other hubs installed on the asset at other locations. Accordingly, the characteristic behavior of the asset and criteria for messaging or alarms from the central server may be based on a comparison of the sensor signals from one hub or set of sensors to sensors at other locations along the route, or a comparison between sensor signals from the same hub or sensor signals from equipment being monitored at different locations. It will be appreciated, with access to the data received from other hubs along the route of the asset, the characteristic behavior of the asset and the criteria for messages, alerts or alarms from the central server may be based on a comparison or analysis of the data from different sensors.

As one example, the cathodic protection (CP) pipe-to-soil potential and CP current measurements along a pipe line may be the sensor signals that represent the characteristic behavior of the pipe line. CP systems can often be characterized better by how the measured parameter value (potential or current) changes based on the locations of several sensors rather than the parameter value associated with a single sensor. Another example includes monitoring the cable shield voltages and currents of each of the three phases of an electric cable. Voltage and current sensors can be connected to the cable shields of each of the three cable phases in link boxes that are installed in the manholes along the route of the cable. The voltage and current sensors can be monitored individually and comparatively between all three phase sensors by the hub. The sensor signals may also be compared at the central server to similarly installed sensors at other hub locations. This monitoring approach serves to characterize the behavior of the cable (or monitored asset) in a manner that will identify abnormal or unusual operating conditions that warrant review and facilitate strategic as opposed to periodic maintenance operations.

In yet a further embodiment, monitoring similar to the adaptive monitoring described above in connection with FIG. 6 can be incorporated into the flow chart of FIG. 7C. Here, the triggers that increase or decrease the sampling interval, sampling frequency and transmission frequency would be based on a comparison of parameters, or sensor signals, from different hubs. Accordingly, small changes in behavior indicative of abnormal operation of the operation of certain assets may be determined by a comparison of data from similar equipment and a more aggressive sampling mode may be initiated prior to failure.

Figure 8:
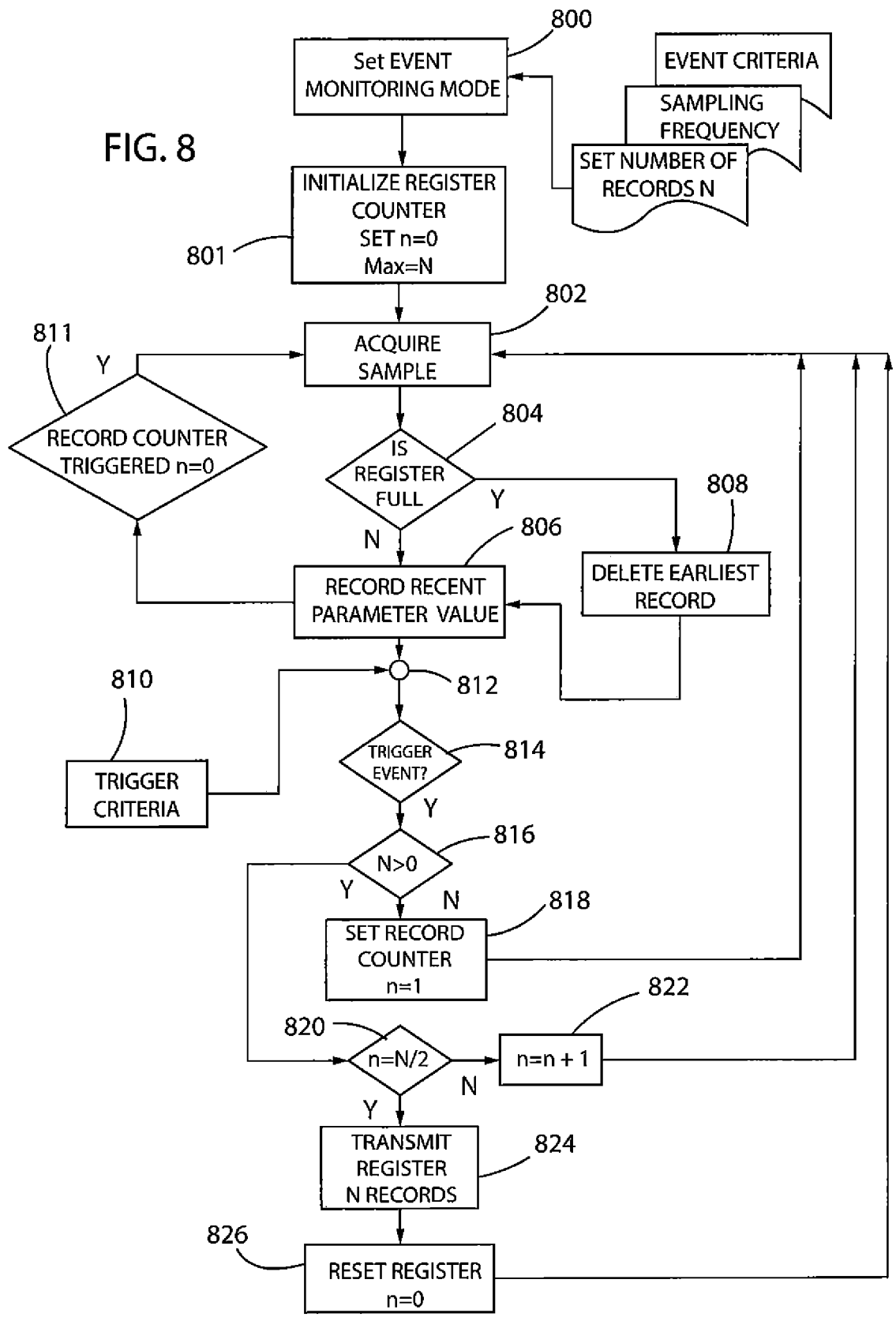
FIG. 8 is a flow chart illustrating the operation of the hub in the watchdog mode.

Turning now to FIG. 8, there is illustrated a flow chart representing the operation of hub 104, and particularly the controller 110 in the hub, referred to here as an event monitor. In this mode, the controller monitors the sensor signals continuously but does not transmit the sensor data unless an event satisfying a preset condition or set of conditions triggers the controller to execute a user defined data recording and transmission protocol. The event monitor mode may be invoked by instructions from the central server, such as determined by a technician at management terminal 124. Additionally, or optionally, the event mode monitor mode may be pre-programmed in the hub controller and invoked in response to particular conditions. In the event monitor mode described hereinbelow, a number N of sensor signal samples are acquired and stored in a suitable register, where N is determined by the technician. When the number of stored samples exceeds a predetermined threshold, for example, when the number of stored samples exceeds N/2, the register is cleared and newly acquired samples are stored. Preferably, the register is cleared one sample at a time, with the oldest sample in the register being deleted, thereby making room for the next newly acquired sample. The samples stored in the register need not be processed for transmission to the central server until an "event," described below, occurs. Accordingly, the register undergoes a circular cycle, storing the most recent N samples, until the occurrence of the "event."

Referring to the flow chart, the event monitor mode is established at step 800 by the technician who sets the value of N and also sets the criteria for the "event." A counter is reset to the count n=0 at step 801. A sample is acquired at step 802; and query 804 determines if the count n has reached N, that is query 804 asks if n=N? If this query is answered in the negative n≠N, the acquired sample is stored, for example, in store 112 (or store 212), as represented by step 806. However, if query 804 is answered in the affirmative, n=N, the earliest sample stored in the register is deleted, as represented by step 808, thus making room for the latest sample that has been acquired; and this latest sample is stored, as represented by step 806. The process cycles through this loop 802, 804, 806, 808 until an "event" occurs.

An "event" occurs if the acquired sample satisfies or exceeds the criteria established by the technician. Examples of this criteria include, but are not limited to, whether the value of the acquired sample exceeds a predetermined threshold, whether the value of the acquired sample is less than a pre-set level, whether the value of the acquired sample is outside predetermined limits, whether the acquired sample differs from the previous sample by more than a predetermined amount, whether the value of the acquired sample differs from the history of samples, whether the acquired sample deviates from historical sample values, whether acquired samples change at a rate greater than a predetermined rate, and the like. A comparison 812 is made between the acquired sample and the established criteria, as represented by step 810. If the acquired sample does not exceed the established criteria, the sample is stored (step 806) and the process continues to cycle through the loop 802, 804, 806, 808. However, if the acquired sample exceeds the established criteria, query 814 is answered in the affirmative, indicating an "event" has occurred and query 816 queries whether the number of stored samples N is greater than 0 (N>0)? If this is the first sample that is acquired, query 816 is answered in the negative and the count n of the counter is set to 1 (n=1) in step 818. The process then returns to step 802 and the next sample is acquired.

However, if the acquired sample is not the first sample, that is N>0, query 816 is answered in the affirmative and the process advances to query 820 to determine if the number n of stored samples is n=N/2. If this query is answered in the negative, the count n of stored samples in incremented by 1 (n=n+1) in step 822; and the process returns to step 802 to acquire the next sample. However, if query 820 is answered in the affirmative (n=N/2), the process proceeds to step 824, and the hub transmits to the central server all of the samples that had been stored in store 112 (or store 212). Accordingly, half of file transmitted to the central server contains pre-trigger records and the other half contains post trigger records. Hence, technicians are able to recognize preview and post view conditions that lead and trail the event. Other conditions may be pre-set to transmit pre- and post-event sample data.

Preferably, the store 112 (or store 212) is not cleared when the samples stored therein are transmitted to the central server. In this manner, by transmitting the stored samples when n=N/2, half the stored samples are those samples that had been acquired previously, i.e. the "oldest" of the stored samples, and half the stored samples are newly acquired.

The count n of the number of stored samples is reset in step 826 to n=0; and the process returns to step 802 to acquire the next sample. Thus, the stored samples are transmitted if an event, mentioned above, occurs.

In another embodiment of the event monitor, upon the occurrence of an event, for example, when query 814 is answered in the affirmative, an alarm is triggered. For example, if the temperature monitored by one of the sensors exceeds a threshold, or if the water level in the vault monitored by another one of the sensors exceeds a predetermined level, or if the pressure monitored by a further one of the sensors exceeds a pre-set threshold, the alarm is triggered. Other examples of alarm-triggering events will be apparent to those of ordinary skill in the art.

While the present invention has been particularly shown and described with reference to preferred embodiments thereof, it will be readily apparent to one of ordinary skill in the art that various changes and modifications in form and details can be made without departing from the spirit and scope of the invention. For example, and as describe above, the antenna connected to the transceiver in the hub described herein can be disposed in the hub itself, externally of the hub but in the vault in which the hub is located, or externally of the hub but underground, such as depicted in FIG. 7A. As another example, the sampler described with reference to FIGS. 1 and 2 may include sample-and-hold and analog-to-digital circuits, such as shown in FIG. 7A. As a further example, although two management terminals are illustrated in FIGS. 1 and 7A, it will be appreciated that a greater or lesser number of management terminals may be provided. Further, some of these management terminals may be limited in their ability to communicate instructions to the hubs to establish or change the sampling and transmission frequencies, discussed above. Such instructions may be transmitted to selected hubs, as desired. Additionally, it will be appreciated that the numerical examples of the sampling interval, sleep interval, transmission interval, sampling frequency and transmission frequency discussed above are not intended to limit the present invention solely to those numerical examples.

Therefore, it is intended that the appended claims be interpreted as including the foregoing as well as various other changes and modifications.

What is claimed is:

1. A remote monitoring system for monitoring parameters of an underground cable system, comprising:
    distributed parameter detectors configured to provide electrical signals representing respective monitored variable parameters of the underground cable system; and
    an underground hub coupled to the parameter detectors and configured to collect the signals provided by the parameter detectors, the underground hub including a controller to provide data representing different values of the respective monitored parameters and derived from the collected signals and a transceiver for transmitting the data via low-power wide-area network (LP-WAN) communications to a central location and for receiving via LP-WAN communications from the central location instructions for controlling the controller, wherein the controller is programmed to process the signals provided by the parameter detectors by sampling the signals during sampling intervals having controllable durations at a changeable sampling frequency and cause the samples to be transmitted to the central location within transmission intervals having controllable durations at a controllably changeable transmission frequency.

2. The remote monitoring system of claim 1, wherein successive transmission intervals are separated by a sleep interval, such that the controller is awakened to transmit the samples during an active operating mode, followed by a return to a sleep mode.

3. The remote monitoring system of claim 1, wherein at least one of the sampling interval and the sampling frequency is established by the instructions received from the central location.

4. The remote monitoring system of claim 1, wherein at least one of the transmission frequency or the transmission intervals are determined by the instructions received from the central location.

5. The remote monitoring system of claim 1, wherein the controller includes a processor programmed to determine particular operating conditions of the underground cable system based on the signals provided by the parameter detectors and to establish at least one of the sampling interval and the sampling frequency in accordance with the determined operating condition.

6. The remote monitoring system of claim 1, wherein the controller includes a processor programmed to determine particular operating conditions of the underground cable system based on the signals provided by the parameter detectors and to establish at least one of the transmission frequency or the transmission intervals in accordance with the determined operating condition.

7. The remote monitoring system of claim 1, wherein the controller normally is operable in a first operating mode to transmit the samples at first transmission frequency and in a second operating mode to transmit the samples at second transmission frequency, the first transmission frequency being less frequently than the second transmission frequency.

8. The remote monitoring system of claim 1, wherein the controller normally is operable in a first operating mode to sample the signals at a first sampling frequency and in a second operating mode to sample the signals at a second sampling frequency, the first sampling frequency being less than the second sampling frequency.

9. The remote monitoring system of claim 7, wherein the instructions received from the central location determine the operating mode of the controller.

10. The remote monitoring system of claim 1, wherein the controller is programmed to determine a statistically derived set of values representative of sample values acquired in a sampling interval and to cause the determined set of values to be transmitted to the central location during the transmission intervals.

11. The remote monitoring system of claim 10, wherein the determined set of values are values representing a selected number of samples, which are less than the number of samples acquired in a sampling interval.

12. The remote monitoring system of claim 10, wherein the controller is programmed to reorder the sample values from lowest sample value to highest sample value; and wherein the determined set of values are the minimum sample value obtained during the sampling interval, the maximum sample value obtained during the sampling interval, the median sample value obtained during the sampling interval, and the sample values corresponding to the respective $25^{th}$ and $75^{th}$ percentiles of the reordered sample values.

13. The remote monitoring system of claim 7, wherein the controller changes to the first operating mode if the data transmitted to the central location does not change over time by an amount greater than a predetermined threshold.

14. The remote monitoring system of claim 7, wherein the controller changes to the first operating mode if the data transmitted to the central location changes at a rate of change less than a predetermined threshold.

15. The remote monitoring system of claim 9, wherein the controller is operable to selectively adjust at least one of the sampling interval, sampling frequency, transmission interval and transmission frequency in response to the instructions received from the central location.

16. The remote monitoring system of claim 15, wherein the central location includes a data processor that processes the samples transmitted from the underground hub to determine operating conditions of the underground cable system.

17. The remote monitoring system of claim 1, wherein the underground hub is mounted in a manhole vault.

18. The remote monitoring system of claim 17, wherein the underground hub includes an antenna within the manhole vault for transmitting the data via LP-WAN communications and for receiving the instructions transmitted from the central location via LP-WAN communications.

19. The remote monitoring system of claim 17, further including an antenna separate from the underground hub for providing a communication link between the central location and the underground hub.

20. The remote monitoring system of claim 1, wherein the controller includes a store for storing start-up instructions to operate the controller in a recovery mode to establish communication with the central location in the event that power to the underground hub is interrupted and then restored or in the event communication between the underground hub and the central location is interrupted and then re-established.

21. The remote monitoring system of claim 20, wherein the controller responds to instructions transmitted from the central location, when power is restored to the underground hub or when communication between the underground hub and the central location is re-established, to sample the signals provided by the parameter detectors at sampling intervals and at a sampling frequency determined by the instructions, and to transmit the samples within transmission intervals and at a transmission frequency determined by the instructions.

22. The remote monitoring system of claim 1, wherein the underground hub includes a store for storing the data provided by the controller; wherein the central location includes a data processor for storing and processing the data transmitted from the underground hub; wherein the controller is operable to compare the data stored in the store of the underground hub with the data transmitted to the central location and in the event of a discrepancy therebetween, transmit data to the central location that had not been transmitted previously.

23. The remote monitoring system of claim 1, wherein the underground cable system is an electric power transmission cable.

24. The remote monitoring system of claim 1, wherein the underground cable system is an oil pipeline.

25. The remote monitoring system of claim 1, wherein the underground cable system is a gas pipeline.

26. The remote monitoring system of claim 1, further including a battery for supplying electric power to the underground hub.

27. The remote monitoring system of claim 1, further including harvesting apparatus for deriving electric power from the underground cable system and supplying the derived electric power to the underground hub.

28. The remote monitoring system of claim 1, wherein the hub includes a store for storing the data derived from the collected signals; and for transmitting at least some of the stored data to the central location when the collected signals meet or exceed predetermined criteria.

29. The remote monitoring system of claim 28, wherein the store replaces older stored data with new data when the collected signals do not meet or exceed the predetermined criteria.

* * * * *

UNITED STATES PATENT AND TRADEMARK OFFICE
CERTIFICATE OF CORRECTION

| | | |
|---|---|---|
| PATENT NO. | : 10,607,475 B1 | Page 1 of 1 |
| APPLICATION NO. | : 16/360256 | |
| DATED | : March 31, 2020 | |
| INVENTOR(S) | : Robert F. Smith et al. | |

It is certified that error appears in the above-identified patent and that said Letters Patent is hereby corrected as shown below:

In the Drawings

Step 660 in Fig. 6 should read "*Increase* Transmission Frequency 2x.".

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*